United States Patent [19]
Takahashi

[11] Patent Number: 6,001,678
[45] Date of Patent: Dec. 14, 1999

[54] INSULATED GATE SEMICONDUCTOR DEVICE

[75] Inventor: Hideki Takahashi, Tokyo, Japan

[73] Assignee: Mitsubishi Denki Kabushiki Kaisha, Tokyo, Japan

[21] Appl. No.: 08/937,163

[22] Filed: Sep. 25, 1997

Related U.S. Application Data

[62] Division of application No. 08/566,572, Nov. 28, 1995.

[30] Foreign Application Priority Data

Mar. 14, 1995 [JP] Japan ...................................... 7-054564

[51] Int. Cl.$^6$ .................... H01L 21/8234; H01L 21/8244
[52] U.S. Cl. .......................... 438/238; 438/243; 438/245; 438/271; 438/268
[58] Field of Search .................................. 438/238, 243, 438/245, 271

[56] References Cited

U.S. PATENT DOCUMENTS

| | | | |
|---|---|---|---|
| 5,171,696 | 12/1992 | Hagino | 437/6 |
| 5,298,780 | 3/1994 | Harada . | |
| 5,304,821 | 4/1994 | Hagino . | |
| 5,326,993 | 7/1994 | Iwamuro . | |
| 5,352,915 | 10/1994 | Hutchings et al. . | |
| 5,357,125 | 10/1994 | Kumagi . | |
| 5,489,787 | 2/1996 | Amaratunga et al. . | |
| 5,541,122 | 7/1996 | Tu et al. . | |
| 5,751,024 | 5/1998 | Takahashi . | |

FOREIGN PATENT DOCUMENTS

| | | |
|---|---|---|
| 0 527 600 | 2/1993 | European Pat. Off. . |
| 0 615 292 | 9/1994 | European Pat. Off. . |

OTHER PUBLICATIONS

Shenai et al, "Optimum Low–Voltage Silicon Power Switches Fabridated Using Scaled Trench MOS Technologies" IEDM 90–793–797, 1990.

Chang et al, "500–V n–Channel Insulated–Gate Bipolar Transistor with a Trench Gate Structure," IEEE Trans. Electron Devices vol. 36, No. 9, pp. 1824–1829, 1989.

Syau et al, "Comparison of Ultralow Specific On–Resistance UMOSFET Structures: The ACCUFET, EXTFET, INFET, and Conventional UMOSFET's, " IEEE Trans. on Electron Devices vol. 41, No. 5, pp. 800–808, 1994.

Patent Abstracts of Japan, vol. 12, No. 420 (E–679), Nov. 8, 1988, JP 63–157478, Jun. 30, 1988.

Patent Abstracts of Japan, vol. 18, No. 531 (E–1614), Oct. 7, 1994, JP 6–188423, Jul. 8, 1994.

*Primary Examiner*—John F. Niebling
*Assistant Examiner*—Jonathan Hack
*Attorney, Agent, or Firm*—Oblon, Spivak, McClelland, Maier & Neustadt, P.C.

[57] ABSTRACT

It is an object to obtain an insulated gate semiconductor device with an unreduced current value capable of being turned off while adopting structure for reducing the ON voltage, and a manufacturing method thereof. An N layer (43) is provided in close contact on a surface of an N$^-$layer (42), a P base layer (44) is provided in close contact on the surface of the N layer (43), and a trench (47) which passes at least through the P base layer (44) is provided, and a gate electrode (49) is provided in the trench (47) through a gate insulating film (48). The carrier distribution of the N$^-$ layer (42) becomes closer to the carrier distribution of a diode, and an ON voltage is decreased and a current value capable of being turned off is not decreased when turning off. Accordingly, there are provided an insulated gate semiconductor device with low power consumption, small size, large capacity and high reliability.

16 Claims, 22 Drawing Sheets

6,001,678

INSULATED GATE SEMICONDUCTOR DEVICE

This is a Division of application Ser. No. 08/566,572 filed on Nov. 28, 1995.

BACKGROUND OF THE INVENTION

1. Field of the Invention

The present invention relates to insulated gate semiconductor devices and manufacturing methods thereof and, particularly to the device structure with a low ON voltage of an insulated gate bipolar transistor having a trench MOS gate and a manufacturing method thereof.

2. Description of the Background Art

FIG. 26 is a cross-sectional view of a conventional insulated gate semiconductor device, and a description is made on an insulated gate bipolar transistor with the trench gate structure (referred to as an IGBT, hereinafter, and an IGBT with the trench gate structure is referred to as a U-type IGBT) as an example.

Recently, the IGBTs are used in the voltage resonance circuits, which are high frequency inverters for energy conservation, miniaturization, and weight reduction of household electric appliances, and used in intelligent power modules for performing variable speed control of three-phase motors in the fields of the general purpose inverters, the AC servo, and the air conditioners, etc., and they are now in general use. In the IGBTs, which are key devices thereof, devices with good switching characteristic, low saturation voltage and large SOA (Safe Operating Area) are demanded while the switching characteristic, the saturation voltage and the SOA are in the trade-off relation.

In FIG. 26, the reference numeral 1 denotes a $P^+$ collector layer, the reference numeral 2 denotes an $N^-$ layer, the reference numeral 3 denotes a P base layer, the reference numeral 4 denotes an $N^+$ emitter layer, the reference numeral 5 denotes a trench, the reference numeral 6 denotes a gate insulating film, the reference numeral 7 denotes a gate electrode, the reference numeral 8 denotes an interlayer insulating film, the reference numeral 9 denotes an $N^+$ buffer layer, the reference numeral 10 denotes an emitter electrode, the reference numeral 11 denotes a collector electrode, and the reference numeral 12 denotes a channel region.

Next, operation of the IGBT will be described.

When a certain collector voltage $V_{CE}$ is applied between the emitter electrode 10 and the collector electrode 11 and a certain gate voltage $V_{GE}$ is applied between the emitter electrode 10 and the gate electrode 7, that is, when the gate is turned on, the channel region 12 is inverted into the N-type and a channel is formed. Electrons are injected from the emitter electrode 10 through the channel into the $N^-$ layer 2. The injected electrons establish forward bias between the $P^+$ collector layer 1 and the $N^-$ layer 2 and holes are injected from the collector electrode 11 via the $P^+$ collector layer 1 and the $N^+$ buffer layer 9 into the $N^-$ layer 2. As a result, resistance of the $N^-$ layer 2 decreases because of the conductivity modulation and the current capacity of the IGBT increases. The voltage drop between collector-emitter of the IGBT at this time is the ON voltage ($V_{CE(SAT)}$).

Next, when turning the IGBT from an ON state to an OFF state, the gate voltage $V_{GE}$ applied between the emitter electrode 10 and the gate electrode 7 is brought to 0 V or the backward bias, that is, the gate is turned off, and then the channel region 12 inverted into the N-type returns to the P-type and the injection of electrons from the emitter electrode 10 is stopped. Subsequently, the electrons and holes accumulated in the $N^-$ layer 2 go through to the collector electrode 11 and the emitter electrode 10, respectively, or they are recombined and disappear.

Generally, the ON voltage of the IGBT is mostly determined by substantial resistance of the $N^-$ layer 2 required to hold the breakdown voltage. Factors of the substantial resistance include the electron supplying capability of the MOSFET forming the IGBT. In the structure of the U-type IGBT in which a narrow and deep trench is formed in the surface of a chip and a MOSFET is formed on the sidewall thereof, the electron supplying capability of the MOSFET can be increased by reducing the unit cell interval as much as possible.

FIG. 27 is a circuit diagram showing an equivalent circuit of the IGBT.

In FIG. 27, the reference numeral 15 is a bipolar transistor, and the reference numeral 16 is a MOSFET.

Generally, the IGBT is represented by the equivalent circuit shown in FIG. 27. Since $h_{fe}$ of the bipolar transistor 15 formed of the $P^+$ collector layer 1, the N layer of a combination of the $N^+$ buffer layer 9 and the $N^-$ layer 2, and the P base layer of the IGBT is small, however, the IGBT can be considered a combination of the MOSFET and the diode 17.

FIG. 28 is a circuit diagram showing an equivalent circuit of the IGBT when $h_{fe}$ of the bipolar transistor 15 is assumed small.

In FIG. 28, the reference numeral 17 is a diode and the reference numeral 18 is a MOSFET.

FIG. 29 is a graph showing the carrier concentration distribution of an $N^-$ layer in an ON state of a PIN diode.

As the MOSFET 18 can be regarded as a mere switching element in FIG. 28, the carrier concentration distribution of the $N^-$ layer of the PIN diode 17 of the IGBT should be something like the carrier concentration distribution of the $N^-$ layer of the PIN diode as shown in FIG. 29, but it is not.

FIG. 30 is a graph showing the carrier concentration distribution of the $N^-$ layer 2 in an ON state in a conventional IGBT.

While the carrier concentration of the $N^-$ layer in the ON state of the PIN diode is uniform between the end of the $N^-$ layer on the anode side and the end on the cathode side as shown in FIG. 29, the carrier concentration of the $N^-$ layer 2 in the ON state in the conventional IGBT gradually decreases from the end of the $N^-$ layer 2 on the collector side to the end on the emitter side, as shown in FIG. 30. Accordingly, the ON voltage of the conventional IGBT is higher than that of the diode.

Especially, in the IGBT with a high breakdown voltage, the breakdown voltage is secured by increasing the thickness of the $N^-$ layer 2. The gradient of the decrease of the carrier concentration of the $N^-$ layer 2 from the end on the collector side toward the end on the emitter side is not affected by the thickness of the $N^-$ layer 2 if the carrier life time is the same, so that the difference in the carrier concentration between the end on the collector side and the end on the emitter side increases as the $N^-$ layer 2 becomes thicker, and the difference in the ON voltage from the diode increases as the IGBT has a higher breakdown voltage.

Various devices are considered for the purpose of eliminating such a difference between the ON voltage of the IGBT and the ON voltage of the diode, which is considered limiting value of the ON voltage of the IGBT. They include the MCT (MOS CONTROLLED THYRISTOR) and the IEGT (INJECTION ENHANCED GATE BIPOLAR TRANSISTOR).

FIG. 31 is a cross-sectional view showing the structure of the MCT.

In FIG. 31, the reference numeral 21 denotes an N+ cathode region, the reference numeral 22 denotes an N region, the reference numeral 23 denotes a P+ region, the reference numeral 24 denotes a channel region in gate on, and the reference numeral 25 denotes a channel region in gate off, or an OFF channel region. Other reference characters are the same as those in FIG. 26.

It is known that the carrier concentration distribution of the N− layer 2 in the ON state in the MCT generally takes the distribution similar to that of a diode. Accordingly, the ON voltage is lower in the MCT than in the IGBT with the conventional structure.

However, when off, the P-channel MOS formed of the P base layer 3, the N region 22 and the P+ region 23 forms a channel by the inversion of the OFF channel region 25, through which channel holes flow. Hence, there is a problem that the current value capable of being turned off can not be large, considering that the resistance of the OFF channel region 25 is generally high. There is also a problem that the processes are complicated and the devices are expensive because an N-channel MOS for ON and a P-channel MOS for OFF must be formed in the triple diffusion in the surface.

Examples of the IEGT include one disclosed in Japanese Patent Laying-Open No. 5-243561.

For example, in the IEGT shown in FIG. 101 of Japanese Patent Laying-Open No. 5-243561, the N emitter regions and the P base regions of some cells in the U-type IGBT are coated with insulating layers, and the contact between the N emitter regions and the P base regions, and the emitter electrode is eliminated.

Operation of the IEGT is basically the same as that of the U-type IGBT, but, since the cells are formed in which contact between the N emitter region and the P base region, and the emitter electrode is not formed, the hole current going through to the P base region in the ON state is restricted, holes are accumulated in the N-type base layer surface, and the carrier concentration distribution of the N-type base layer results in the same one as that of a diode, and the ON voltage of the IEGT becomes lower than the U-type IGBT.

It operates basically in the same way as the U-type IGBT also in the OFF state, but a less number of cells operate as compared with the U-type IGBT when holes accumulated in the N-type base layer go through to the emitter electrode, and the holes go through a less number of cells.

The movement of holes at this time becomes a base current of a parasitic bipolar transistor formed of the N-type base layer, the P base region and the emitter region, and when it exceeds the built-in potential (generally 0.6 V), the parasitic bipolar transistor turns on. Accordingly, in the IEGT in which part of cells of the U-type IGBT are taken away, a current value capable of being turned off may have to be set smaller than in the common U-type IGBT so that the parasitic transistor will not turn on.

SUMMARY OF THE INVENTION

According to a first aspect of the present invention, an insulated gate semiconductor device comprises: a first semiconductor layer of a first conductivity type having first and second main surfaces; a second semiconductor layer of a second conductivity type with a low impurity concentration provided on the first main surface of the first semiconductor layer; a third semiconductor layer of the second conductivity type with an impurity concentration higher than the impurity concentration of the second semiconductor layer provided in close contact on a surface of the second semiconductor layer; a fourth semiconductor layer of the first conductivity type provided in close contact on a surface of the third semiconductor layer; a fifth semiconductor layer of the second conductivity type selectively provided in a surface of the fourth semiconductor layer; a trench having an opening in a surface of the fifth semiconductor layer and having a depth extending through at least the fourth semiconductor layer from the surface of the fifth semiconductor layer; an insulating film provided on an inner wall of the trench; a control electrode provided in the trench, facing the fourth semiconductor layer through the insulating film; a first main electrode provided on the surface of the fourth and fifth semiconductor layers; and a second main electrode provided on the second main surface of the first semiconductor layer.

Preferably, according to a second aspect of the present invention, the trench has a depth which extends through the third semiconductor layer as well to reach the second semiconductor layer.

Preferably, according to a third aspect of the present invention, the trench has a depth which stays in the third semiconductor layer.

Preferably, according to a fourth aspect of the present invention, the second semiconductor layer extends through the first semiconductor layer and is partially exposed in the second main surface of the first semiconductor layer.

Preferably, according to a fifth aspect of the present invention, a sixth semiconductor layer of the second conductivity type with an impurity concentration higher than the impurity concentration of the second semiconductor layer is provided between the first semiconductor layer and the second semiconductor layer.

Preferably, according to a sixth aspect of the present invention, the sixth semiconductor layer extends through the first semiconductor layer and is partially exposed in the second main surface of the first semiconductor layer.

Preferably, according to a seventh aspect of the present invention, the trench includes a plurality of unit trenches arranged side by side, and a part of the exposed surface of the fourth semiconductor layer is arranged being interposed between the unit trenches adjacent each other.

Preferably, according to an eighth aspect of the present invention, the exposed surface of the fourth semiconductor layer is divided into a plurality of unit exposed surfaces by a part of the fifth semiconductor layer, the plurality of unit exposed surfaces being provided alternately with part of the fifth semiconductor layer along the trench.

According to a ninth aspect of the present invention, a method of manufacturing an insulated gate semiconductor device comprises: a substrate forming step of forming a semiconductor substrate defining first and second main surfaces and having a first semiconductor layer of a first conductivity type and a second semiconductor layer of a second conductivity type with a low impurity concentration, the first semiconductor layer being exposed in the first main surface and the second semiconductor layer being exposed in the second main surface; a first implantation step of implanting and diffusing impurity of the second conductivity type to an impurity concentration higher than the impurity concentration of the second semiconductor layer into the second main surface of the semiconductor substrate to form a third semiconductor layer of the second conductivity type in a surface portion of the second semiconductor layer; a second implantation step of implanting and diffusing impurity of the first conductivity type in a surface of the third semiconductor layer to form a fourth semiconductor layer of the first conductivity type in a surface portion of the third semiconductor layer; a third implantation step of forming a resist pattern selectively having an opening in a surface of the fourth semiconductor layer on the surface of the fourth semiconductor layer and implanting and diffusing impurity of the second conductivity type using the resist pattern as a mask to selectively form a fifth semiconductor layer of the second conductivity type in a surface portion of the fourth semiconductor layer; a first removing step of forming a shield film having an opening surrounding a part of a surface of the fifth semiconductor layer on the surface of the fourth semiconductor layer and the surface of the fifth semiconductor layer and selectively removing the semiconductor substrate using the shield film as a mask to form a trench with a depth extending through at least the fourth semiconductor layer, and removing the shield film after that; a first step of forming an insulating film on the surfaces of the trench, the fourth semiconductor layer and the fifth semiconductor layer; a first provision step of providing a conductor on the insulating film so that the trench is filled; a second removing step of uniformly removing the provided conductor to the opening of the trench so as to leave the conductor in the trench as a control electrode; a second provision step of providing an insulating layer on the surface of the insulating film and a surface of the conductor buried in the trench; a third removing step of forming a resist pattern having an opening surrounding the surface of the fourth semiconductor layer and a part of the surface of the fifth semiconductor layer on the surface of the insulating layer and selectively removing the insulating layer and the insulating film using the resist pattern as a mask; a step of providing a conductor on the surfaces of the fourth and fifth semiconductor layers exposed by the third removing step to form a first main electrode; and a step of providing a conductor on the first main surface of the semiconductor substrate to form a second main electrode.

Preferably, according to a tenth aspect of the present invention, in the first removing step, the trench is formed with a depth extending also through the third semiconductor layer.

Preferably, according to an eleventh aspect of the present invention, the trench is formed with a depth which stays in the third semiconductor layer in the first removing step.

Preferably, according to a twelfth aspect of the present invention, the substrate forming step comprises the steps of; preparing a semiconductor substrate body of the first conductivity type having two main surfaces, and providing a semiconductor layer of the second conductivity type with a low impurity concentration by epitaxial growth on one of the main surfaces of the semiconductor substrate body to form the second semiconductor layer.

Preferably, according to a thirteenth aspect of the present invention, the substrate forming step comprises the steps of; preparing a semiconductor substrate body of the second conductivity type with a low impurity concentration having two main surfaces, implanting impurity of the first conductivity type into one of the main surfaces of the semiconductor substrate body; and diffusing the impurity implanted into the one main surface to form the first semiconductor layer of the first conductivity type.

Preferably, according to a fourteenth aspect of the present invention, the step of implanting the impurity of the first conductivity type comprises the steps of, forming a resist pattern having a selectively formed opening on one of the main surfaces of the semiconductor substrate body, and selectively implanting impurity of the first conductivity type into the one main surface of the semiconductor body using the resist pattern formed on the one main surface as a mask.

Preferably, according to a fifteenth aspect of the present invention, the semiconductor substrate formed in the substrate forming step further comprises a sixth semiconductor layer of the second conductivity type with a high impurity concentration interposed between the first semiconductor layer and the second semiconductor layer.

Preferably, according to a sixteenth aspect of the present invention, the substrate forming step comprises the steps of; preparing a semiconductor substrate body of the first conductivity type having two main surfaces, and sequentially forming the sixth semiconductor layer and the second semiconductor layer by the epitaxial growth on one of the main surfaces of the semiconductor substrate body.

Preferably, according to a seventeenth aspect of the present invention, the substrate forming step comprises the steps of; preparing a semiconductor substrate body of the second conductivity type with a low impurity concentration having two main surfaces, forming the sixth semiconductor layer by implanting impurity of the second conductivity type and then diffusing on one of the main surfaces of the semiconductor substrate body, and implanting and then diffusing impurity of the first conductivity type in a surface of the sixth semiconductor layer to form the first semiconductor layer.

Preferably, according to an eighteenth aspect of the present invention, the step of forming the first semiconductor layer comprises the steps of; forming a resist pattern having a selectively formed opening on the surface of the sixth semiconductor layer, selectively implanting impurity of the first conductivity type into the surface of the sixth semiconductor layer using the resist pattern formed on the surface of the sixth semiconductor layer as a mask, and diffusing the impurity selectively implanted into the surface of the sixth semiconductor layer.

Preferably, according to a nineteenth aspect of the present invention, if the impurity concentrations in the second semiconductor layer, the third semiconductor layer and the fourth semiconductor layer are taken as $C_2$, $C_3$, $C_4$, respectively, the first implantation step and the second implantation step are carried out so that the relation is $C_2 < C_3 < C_4$.

According to the insulated gate semiconductor device of the first aspect, carriers, e.g., holes passing through to the first main electrode via the third semiconductor layer in a state where the gate is ON are restricted by the third semiconductor layer and accumulated in the second semiconductor layer in the vicinity of the boundary between the second semiconductor layer and the third semiconductor layer, and the carrier distribution of the second semiconductor layer resembles the carrier distribution of a diode. This reduces the ON voltage. When the gate changes from the ON state to the OFF state, when electrons and holes accumulated in the second semiconductor layer respectively move to the second main electrode and the first main electrode, the effect as a barrier on movement of holes via the third semiconductor layer is small because a high voltage is applied between the first main electrode and the second main electrode. Accordingly, a current value capable of being turned off is not decreased in spite of the low ON voltage. Thus, an insulated gate semiconductor device with low power consumption, small size, large capacity and high reliability is realized.

In accordance with the insulated gate semiconductor device according to the second aspect, since the trench has a depth which passes also through the third semiconductor layer and reaches the second semiconductor layer, the electric field concentration at the end of the trench is moderated and it is easy to ensure the breakdown voltage. Hence, it enables construction of elements ranging from a relatively low voltage class to a high voltage class, and is applicable to various required specifications.

In accordance with the insulated gate semiconductor device according to the third aspect, as the trench has a depth which stays in the third semiconductor layer, the thickness of the third semiconductor layer with high impurity concentration is large and the ON voltage is further decreased. Accordingly, an insulated gate semiconductor device with low power consumption can be provided especially in the high breakdown voltage class.

In accordance with the insulated gate semiconductor device according to the fourth aspect, as the second semiconductor layer extends through the first semiconductor layer and is partially exposed in the second main surface of the first semiconductor layer and the second semiconductor layer is shorted with the second main electrode, electrons can easily be moved to the second main electrode when turning off, resulting in high switching speed.

In accordance with the insulated gate semiconductor device according to the fifth aspect, as the sixth semiconductor layer of the second conductivity type with an impurity concentration higher than the impurity concentration of the second semiconductor layer is disposed between the first semiconductor layer and the second semiconductor layer, extension of a depletion layer is stopped by the sixth semiconductor layer in the OFF state. Accordingly, punch-through is not apt to occur and the breakdown voltage is high.

In accordance with the insulated gate semiconductor device according to the sixth aspect, since the sixth semiconductor layer extends through the first semiconductor layer and is partially exposed in the second main surface of the first semiconductor layer, the sixth semiconductor layer is shorted with the second main electrode. As a result, electrons move easily to the second main electrode when turning off, and the switching speed is increased.

In accordance with the insulated gate semiconductor device of the seventh aspect, since a plurality of trenches are provided and a part of the exposed surface of the fourth semiconductor layer is arranged being interposed between adjacent trenches, a channel region can be taken large when configuring a plurality of cells, which enables downsizing and large capacity.

In accordance with the insulated gate semiconductor device according to the eighth aspect, since the exposed surface of the fourth semiconductor layer is divided into a plurality by a part of the fifth semiconductor layer and they are disposed alternately with the part of the fifth semiconductor layer along the trench, a contact region in which the first main electrode makes contact with the fourth semiconductor layer and the fifth semiconductor layer can be made using the fifth semiconductor layer provided between the fourth semiconductor layers. As a result, it is not necessary to consider mask errors when forming the contact region, and the cells can be made smaller and can have higher density, so that the ON voltage can be reduced. Furthermore, contact regions can be arranged in good balance in the entire surface of the element and thus the performance characteristics of cells can be made uniform in the entire surface of the element.

In accordance with the method of manufacturing the insulated gate semiconductor device according to the ninth aspect, impurity of the second conductivity type is implanted and diffused to an impurity concentration higher than the impurity concentration of the second semiconductor layer in the exposed surface of the second semiconductor layer of the semiconductor substrate to form the third semiconductor layer, the fourth semiconductor layer of the first conductivity type is formed on the surface of the third semiconductor layer, the fifth semiconductor layer is selectively formed in the surface of the fourth semiconductor layer, a trench extending at least through the fourth semiconductor layer is formed in a part of the surface of the fifth semiconductor layer, an insulated film is formed on the surface of the trench, and a conductor is provided on the insulating film and removed uniformly to the opening of the trench, leaving the conductor in the trench as a control electrode, so that an insulated gate semiconductor device with a low ON voltage and an unreduced current value capable of being turned off can be manufactured at low cost without using complicated processes.

In accordance with the method of manufacturing the insulated gate semiconductor device according to the tenth aspect, a trench passing through the third semiconductor layer is formed in a part of the surface of the fifth semiconductor layer, so that an insulated gate semiconductor device applicable to a variety of required specifications can be manufactured at low cost without using complicated processes.

In accordance with the method of manufacturing the insulated gate semiconductor device according to the eleventh aspect, since the trench which stays in the third semiconductor layer is formed in a part of the surface of the fifth semiconductor layer, an insulated gate semiconductor device with a low ON voltage and small power consumption can be manufactured at low cost by using processes with a short procedure time especially in the high breakdown voltage class.

In accordance with the method of manufacturing the insulated gate semiconductor device according to the twelfth aspect, as the second semiconductor layer of the second conductivity type with a low impurity concentration is formed by the epitaxial growth on the surface of the semiconductor substrate of the first conductivity type in the process of forming the semiconductor substrate, a device, especially with a relatively thin second semiconductor layer and a low breakdown voltage can be manufactured without using complicated processes in a short manufacturing time.

In accordance with the method of manufacturing the insulated gate semiconductor device according to the thirteenth aspect, in the step of forming the semiconductor substrate, impurity of the first conductivity type is implanted into the surface of the semiconductor substrate of the second conductivity type with a low impurity concentration and then diffused to form the first semiconductor layer of the first conductivity type, so that the step of forming the semiconductor substrate include the diffusion step as a main process. Accordingly, devices especially with a relatively thick second semiconductor layer and a high breakdown voltage can be manufactured at low cost.

In accordance with the method of manufacturing the insulated gate semiconductor device according to the fourteenth aspect, as the resist pattern having a selectively formed opening is formed on the one main surface of the semiconductor substrate and the impurity of the first conductivity type is implanted by using the resist pattern as a mask, the exposed surface of the second semiconductor layer can be formed simultaneously with the implant and diffusion process for forming the second semiconductor layer. Accordingly, an insulated gate semiconductor device with high switching speed can be efficiently produced at low cost.

In accordance with the method of manufacturing the insulated gate semiconductor device according to the fifteenth aspect, in the step of forming the semiconductor substrate, as the semiconductor substrate is formed in which the second semiconductor layer of the second conductivity type with a low impurity concentration is provided on one main surface of the first semiconductor layer of the first conductivity type through the sixth semiconductor layer of the second conductivity type with the high impurity concentration, an insulated gate semiconductor device which is not prone to punch-through can be manufactured at low cost.

In accordance with the method of manufacturing the insulated gate semiconductor device according to the sixteenth aspect, since the sixth semiconductor layer and the second semiconductor layer are sequentially formed on the one main surface of the semiconductor substrate of the first conductivity type by the epitaxial growth, an insulated gate semiconductor device which is not apt to suffer from punch-through can be manufactured at low cost using processes with a short procedure time.

In accordance with the method of manufacturing the insulated gate semiconductor device according to the seventeenth aspect, impurity of the second conductivity type is implanted and diffused into the one main surface of the semiconductor substrate of the second conductivity type with a low impurity concentration to form the sixth semiconductor layer, and then impurity of the first conductivity type is implanted and diffused into the surface of the sixth semiconductor layer to form the first semiconductor layer, so that an insulated gate semiconductor device which is not apt to suffer from punch-through can be manufactured at low cost by using processes mainly including a diffusion step.

In accordance with the method of manufacturing the insulated gate semiconductor device according to the eighteenth aspect, the resist pattern having a selectively formed opening is formed on the surface of the sixth semiconductor layer and impurity of the first conductivity type is implanted using this resist pattern as a mask, so that the exposed surface of the sixth semiconductor layer can be formed simultaneously with the implant and diffusion process for forming the first semiconductor layer. Accordingly, an insulated gate semiconductor device which is not apt to suffer from punch-through and has a high switching speed can be manufactured efficiently at low cost.

In accordance with the method of manufacturing the insulated gate semiconductor device according to the nineteenth aspect, if the impurity concentrations of the second semiconductor layer, the third semiconductor layer and the fourth semiconductor layer are taken to be $C_2$, $C_3$, and $C_4$, respectively, the first implantation process and the second implantation process are carried out so that they have the relation of $C_2<C_3<C_4$, and then a time required for the diffusion process is reduced. Accordingly, an insulated gate semiconductor device can be manufactured at low cost.

The present invention has been made to solve such problems as described earlier, and it is an object of the present invention to provide an insulated gate semiconductor device in which a current value capable of being turned off is not decreased even if structure for reducing the ON voltage is adopted and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
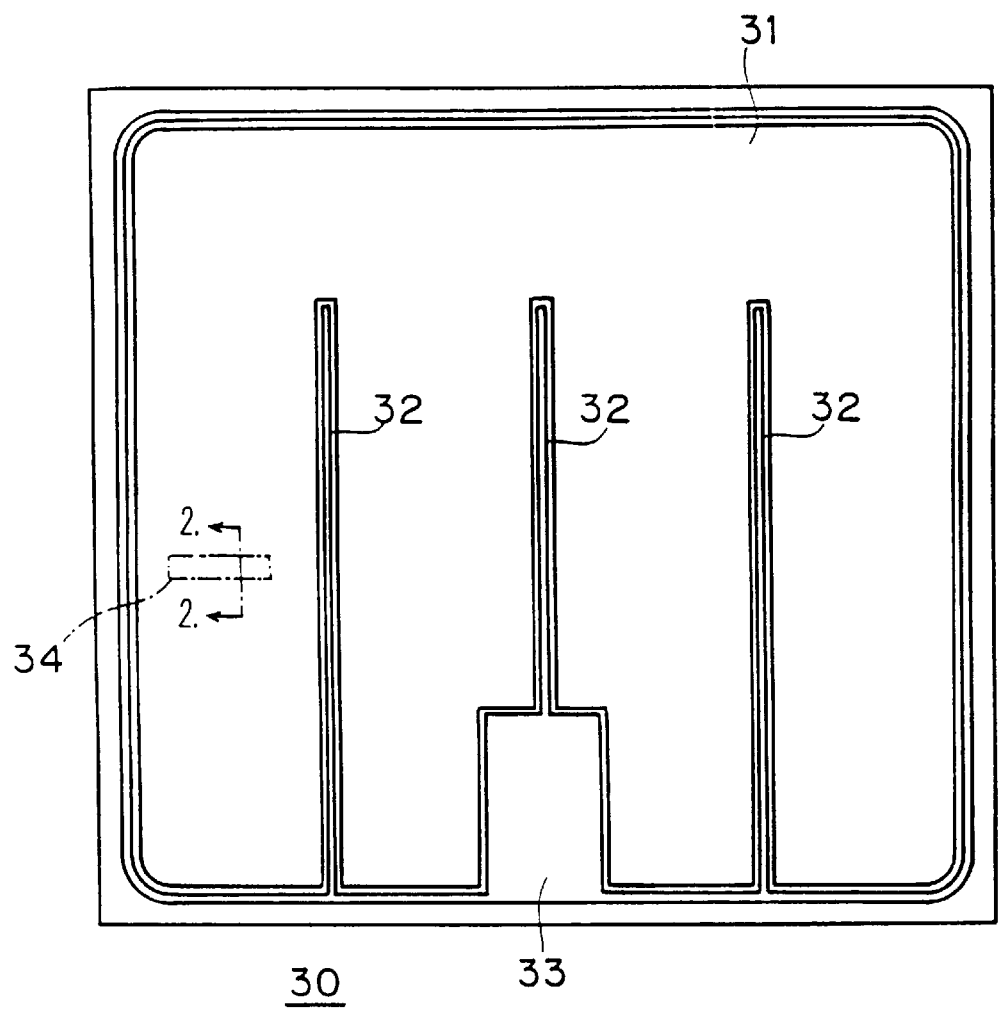
FIG. 1 is a plan view of an insulated gate semiconductor device according to a preferred embodiment of the present invention.

FIG. 1 is a plan view of an insulated gate semiconductor device according to a preferred embodiment of the present invention. The description will now be given on a U-type IGBT as an example of the insulated gate semiconductor device.

Figure 2:
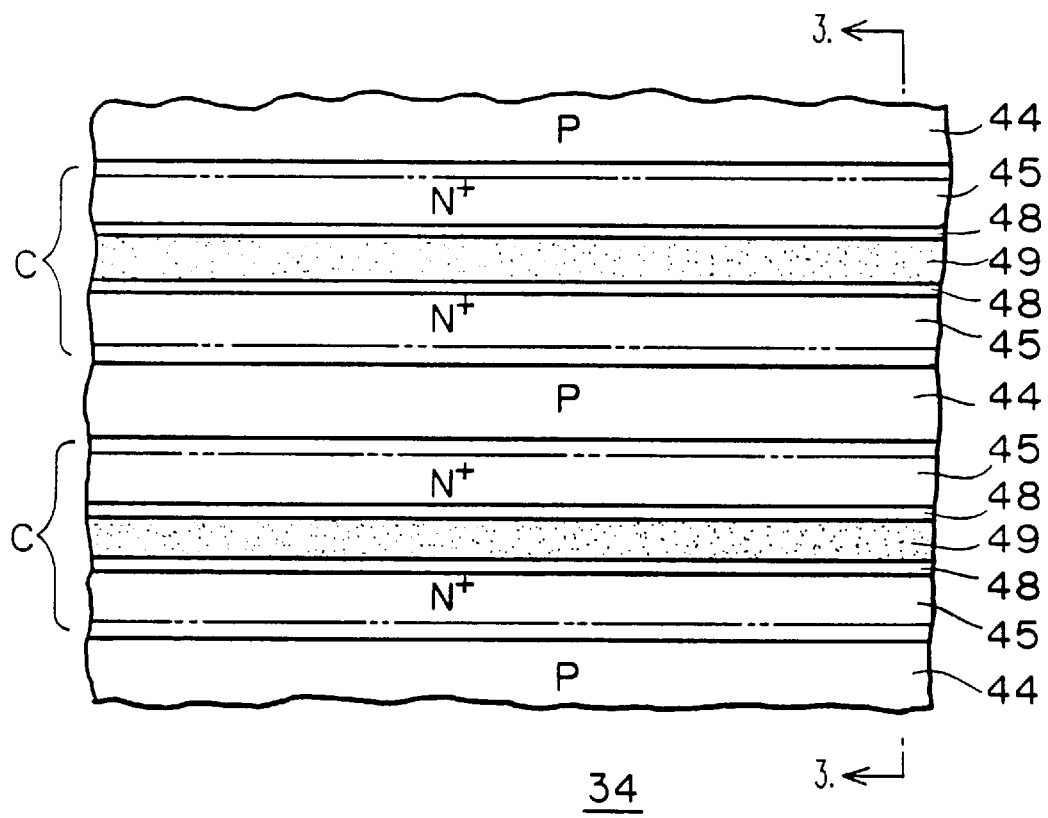
FIG. 2 is a partial plan view of part of cells of the insulated gate semiconductor device of the present invention.
Figure 3:
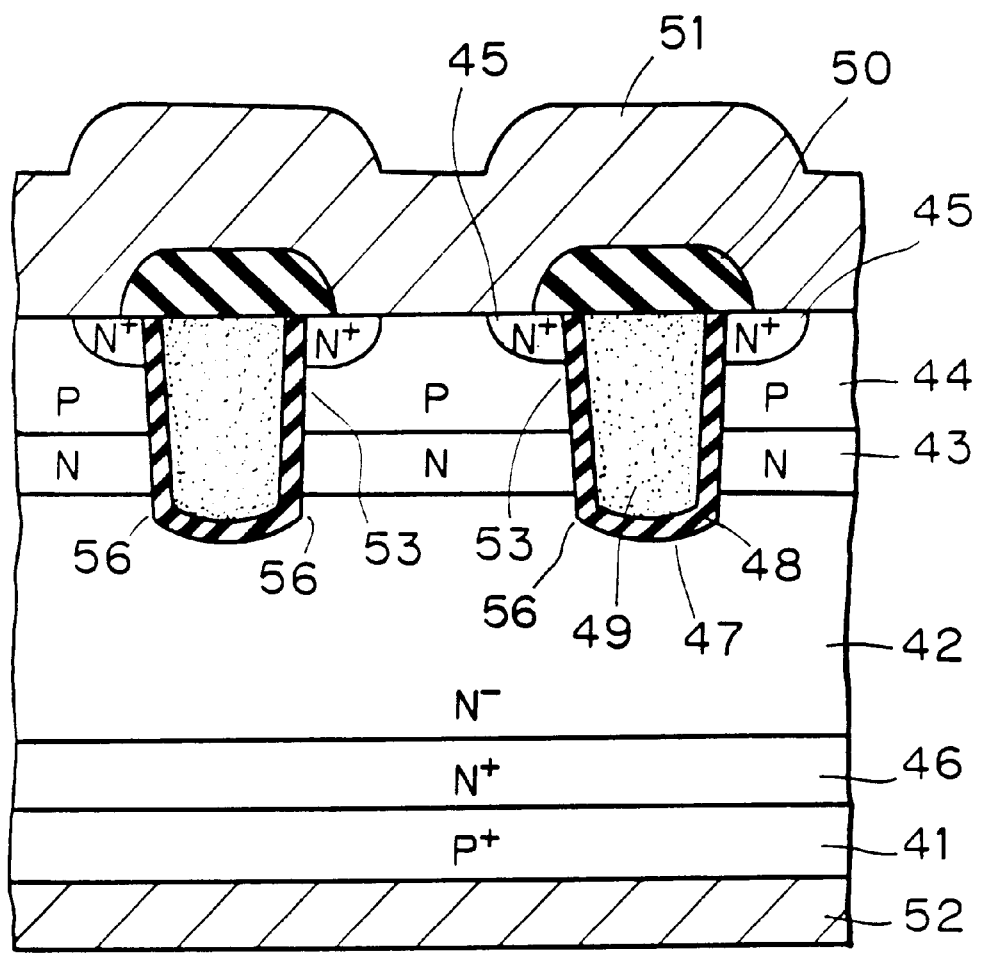
FIG. 3 is a fragmentary sectional view of part of cells of the insulated gate semiconductor device of the present invention.

FIG. 2 is a fragmentary plan view of part of cells of the U-type IGBT shown in FIG. 1, and FIG. 3 is a fragmentary sectional view taken along the A—A section ot the part of cells shown in FIG. 2. FIG. 2 is depicted with the emitter electrode 51 and the interlayer insulating film 50 in FIG. 3 removed therefrom.

In FIG. 1, the reference numeral 30 denotes a U-type IGBT, the reference numeral 31 denotes an emitter electrode as a first main electrode, the reference numeral 32 denotes a gate interconnection, the reference numeral 33 denotes a gate pad and the reference numeral 34 denotes part of cells.

In FIG. 2 and FIG. 3, the reference numeral 41 denotes a $P^+$ collector layer as a first semiconductor layer, the reference numeral 42 denotes an $N^-$ layer as a second semiconductor layer, the reference numeral 43 denotes an N layer as a third semiconductor layer, the reference numeral 44 denotes a P base layer as a fourth semiconductor layer, the reference numeral 45 denotes an $N^+$ emitter region as a fifth semiconductor layer, the reference numeral 46 denotes an $N^+$ buffer layer as a sixth semiconductor layer, the reference numeral 47 denotes a trench as a groove, the reference numeral 48 denotes a gate insulating film as an insulating film, the reference numeral 49 denotes a gate electrode as a control electrode, the reference numeral 50 denotes an interlayer insulating film and the reference numeral 51 denotes an emitter electrode as a first main electrode, which is a part of the emitter electrode 31 shown in FIG. 1. The reference numeral 52 denotes a collector electrode as a second main electrode, the reference numeral 53 denotes a channel region and the reference numeral 56 denotes an end corner of the trench 47. In FIG. 2, the regions C between the two-dot chain lines designated by the braces are regions covered with the interlayer insulating film 50.

The gate insulating film 48 is usually a thermal oxide film which is $SiO_2$, and the gate electrode 49 is polysilicon doped with P-type impurities. The interlayer insulating film 50 is formed of silicate glass containing boron and phosphorus (referred to as BPSG, hereinafter), the emitter electrode 51, the gate interconnection 32 and the gate pad 33 are formed of AL containing Si (referred to as Al—Si, hereinafter), and the collector electrode 52 is formed of AlMoNiAu alloy, respectively.

The gate interconnection 32 is connected to the gate electrode 49 of the cells, and it has a function of reducing the polysilicon part in the route from the gate electrode 49 to the gate pad 33 so as to decrease the electric resistance from the gate electrode 49 to the gate pad 33, and making the control operation of elements uniform in the entire area of the elements.

In the U-type IGBT of this preferred embodiment, the $N^+$ buffer layer 46 is provided on the surface of the $P^+$ collector layer 41, and the $N^-$ layer 42 is provided on the surface of the $N^+$ buffer layer 46. Further, the N layer 43 is provided on the $N^-$ layer 42, and the P base layer 44 is provided thereon. The $N^+$ emitter regions 45 are provided in the surface of the P base layer 44 like belts at intervals, and the trench 47 which extends from the surface of the $N^+$ emitter layer 45 through the P base layer 44 and the N layer 43 to reach the $N^-$ layer 42 is provided along the elongate direction of the beltlike shape of the $N^+$ emitter region 45.

The gate insulating film 48 is provided on the inner wall of the trench 47 and the gate electrode 49 is buried inside of the trench 47 to the opening in the surface of the $N^+$ emitter region 45. Accordingly, the gate electrode 49 faces the surface of the P base layer 44 through the gate insulating film 48 in the trench 47, and the surface of the P base layer 44 to which the gate electrode 49 faces becomes the channel region 53.

Adjacent trenches 47 are disposed through the $N^+$ emitter regions 45 adjacent to the respective trenches 47 and the exposed surface of the P base layer 44 disposed between the $N^+$ emitter regions 45.

The surface of the gate electrode 49 is covered with the interlayer insulating film 50, and the emitter electrode 51 is provided on the surface of the element where the $N^+$ emitter regions 45 and the P base layers 44 are provided, through the interlayer insulating film 50, so that the $N^+$ emitter regions 45 and the P base layers 44 are shorted. The gate interconnection 32 connected to the gate electrodes 49 and the gate pad 33 are provided on the surface of the element being insulated from the $N^+$ emitter regions 45 and the P base layers 44. The collector electrode 52 is provided on the other surface of the $P^+$ collector layer 41.

As examples of dimensions of respective parts in an element in the breakdown voltage 2000 V class, the thickness from the surface of the element, i.e., the exposed surface of the P base layer 44 or the surface of the $N^+$ emitter layer 45 to the boundary between the $N^-$ layer 42 and the $N^+$ buffer layer 46 is about 200 µm, the impurity concentration of the $N^-$ layer 42 is $5 \times 10^{13}$ cm$^{-3}$, the interval of the trenches 47 is about 4 µm, and the depth of the trench 47 from the surface of the $N^+$ emitter region 45 is about 8 µm. The depths of the junction surface of the bottom of the $N^+$ emitter region 45 and the P base layer 44, the junction surface of the P base layer 44 and the N layer 43 and the junction surface of the N layer 43 and the $N^-$ layer 42 are respectively about 1 µm, about 3 µm and about 7 µm from the surface of the $N^+$ emitter region 45 or the P base layer 44. The thickness of the $N^+$ layer 46 is about 10 µm, and the thickness of the $P^+$ collector layer 41 is about 300 µm.

Next, operation will be described.

When a certain collector voltage $V_{CE}$ is applied between the emitter electrode 51 and the collector electrode 52 and a certain gate voltage $V_{GE}$ is applied between the emitter electrode 51 and the gate electrode 49, that is, when the gate is turned on, the channel region 53 is inverted into the N-type and a channel is formed. Electrons are injected through the channel from the emitter electrode 51 via the N layer 43 into the $N^-$ layer 42. The injected electrons establish forward bias between the $P^+$ collector layer 41 and the $N^-$ layer 42 through the $N^+$ buffer layer 46 and holes are injected from the collector electrode 52 via the $P^+$ collector layer 41 and the $N^+$ buffer layer 46 into the $N^-$ layer 42. As a result, resistance of the $N^-$ layer 42 considerably decreases because of conductivity modulation and the current capacity of the IGBT increases.

The holes injected into the $N^-$ layer 42 go through to the emitter electrode 51, but the N layer 43 is provided between the $N^-$ layer 42 and the P base layer 44, intersecting the route of movement of the holes between the trenches 47. Accordingly, the N layer 43 restricts the movement of the holes to the P base layer 44, and the holes are accumulated in the $N^-$ layer 42 in the vicinity of the boundary between the $N^-$ layer 42 and the N layer 43, resulting in such carrier distribution of the $N^-$ layer 42 as that of the diode shown in FIG. 29. Hence, the carrier distribution of the $N^-$ layer 42 will not decrease on the emitter side, as in the conventional IGBT, and the ON voltage in the IGBT of this preferred embodiment is lower than that in the conventional IGBT.

Next, when turning the IGBT from an ON state to an OFF state, the gate voltage $V_{GE}$ applied between the emitter electrode 51 and the gate electrode 49 is brought to 0 V or the backward bias, that is, the gate is turned off, and then the channel region 53 inverted into the N-type returns to the P-type and the injection of electrons from the emitter electrode 51 is stopped and the injection of holes from the $P^+$ collector layer 41 to the $N^-$ layer 42 is also stopped. Subsequently, the electrons and holes accumulated in the $N^-$ layer 42 go through to the collector electrode 52, the emitter electrode 51, respectively, or they are rebonded and disappear.

While the N layer 43 is provided intersecting the route along which the holes go through to the emitter electrode 51, a high voltage, e.g., 2000 V in this preferred embodiment, is applied as a collector voltage in an OFF state, unlike in the ON state. Accordingly, the N layer 43 with this thickness does not serve as a barrier, producing no effect on the movement of the holes. Hence, a current value almost the same as that in the conventional IGBT is ensured as a current value capable of being turned off, and which is not reduced.

Figure 4:
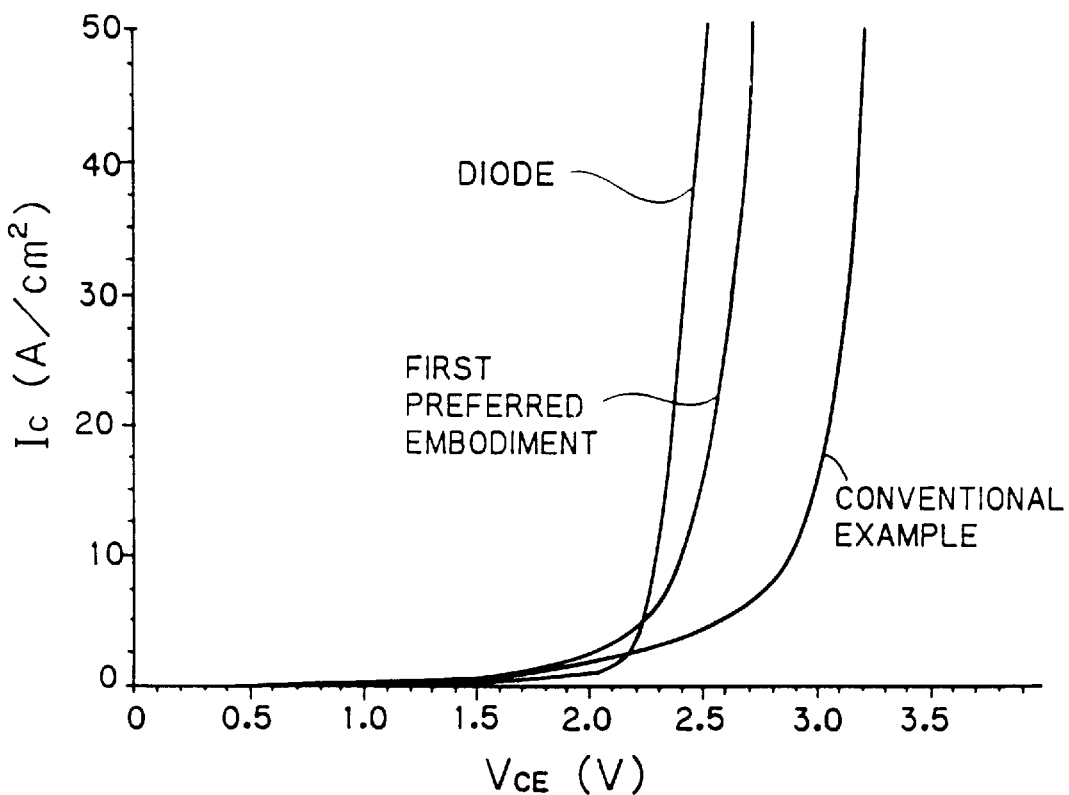
FIG. 4 is a graph showing results of comparison of ON voltages of the insulated gate semiconductor device of this invention, a PIN diode and a conventional insulated gate semiconductor device.
Figure 5:
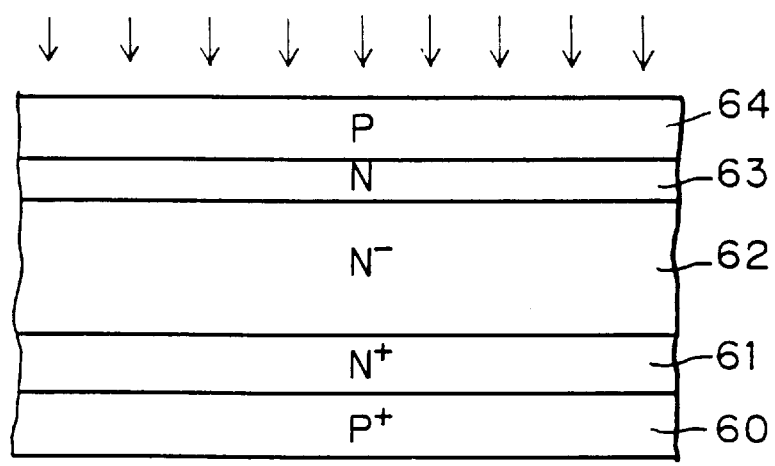
FIG. 5 is a fragmentary sectional view of the element in a process of manufacturing the insulated gate semiconductor device of the present invention.

FIG. 4 is a graph showing results of comparison and consideration of the ON voltages of the U-type IGBT of this preferred embodiment, the PIN diode and the conventional U-type IGBT by simulation.

In FIG. 4, $V_{CE}$ is a collector voltage and $I_C$ is a collector current. For comparison, $V_f$ which is equivalent to the ON voltage of the IGBT was also computed about the PIN diode. In this PIN diode, an $N^+$ layer of 1 µm is provided in the $N^-$ layer.

As can be seen from the graph of FIG. 4, comparison of the ON voltages with the current value 50 A/cm$^2$ as a rated current results in 2.5 V in the diode, 2.7 V in the IGBT having the N layer 43 of this preferred embodiment, and 3.2 V in the conventional IGBT with no N layer 43, and $V_{CE(SAT)}$ of the IGBT with the N layer 43 shows almost the same value as $V_f$ of the diode.

As discussed above, according to this preferred embodiment, a U-type IGBT with a low ON voltage and a current value capable of being turned off unreduced can be obtained with the simple structure in which the N layer 43 is provided between the $N^-$ layer 42 and the P base layer 44 in the U-type IGBT.

Also, in this preferred embodiment, the end of the trench 47 slightly protrudes from the N layer 43. The breakdown voltage of the U-type IGBT is determined by the electric field distribution in the vicinity of the corner 56 of the end of the trench 47. Accordingly, with the structure with the end of the trench 47 slightly protruding from the N layer 43, a depletion layer extends in the lateral direction when a collector voltage is applied and the electric field concentration in the vicinity of the end corner 56 of the trench 47 is moderated.

The effect of moderating the electric field concentration in the vicinity of the end corner 56 of the trench 47 does not appear considerably particularly when the collector voltage is high as in this simulation condition, but it considerably affects in the case of a relatively low collector voltage such as several hundred V and the breakdown voltage is secured. Accordingly, the structure with the end of the trench 47 slightly protruding from the N layer 43 provides a U-type IGBT in which the breakdown voltage is easy to ensure in a wide variety of voltage classes ranging from elements with a relatively low voltage to elements with a high voltage.

Next, one example of the method of manufacturing the U-type IGBT of this preferred embodiment will be described.

FIG. 5–FIG. 12 are fragmentary sectional views showing the element in each process.

First, an $N^+$ layer 61 and an $N^-$ layer 62 are sequentially formed on a $P^+$ silicon substrate 60 by the epitaxial growth. Next, N-type impurities are implanted in the surface of the $N^-$ layer 62 and annealing is applied so that the N-type impurities are diffused to form an N layer 63. Further, P-type impurities are implanted into the surface of the N layer 63 and annealing is applied to form a P base layer 64.

In this process, if impurity concentrations of the $N^-$ layer 62, the N layer 63 and the P base layer 64 are respectively represented by $C_2$, $C_3$, $C_4$, performing the implant and diffusion of the N-type impurities and the P-type impurities so that $C_2 < C_3 < C_4$ will facilitate implantation of the P-type impurities and a manufacturing time can be reduced. (Refer to FIG. 5)

Next, resist is provided on the surface of the P base layer 64 and a resist pattern 65 with a plurality of parallel zonal openings is formed by the photolithographic process, and using which resist pattern 65 as a mask, N-type impurities are implanted to a high concentration in the surface of the P base layer 64 and diffused by annealing, and thus the N+ emitter regions 66 are formed. (Refer to FIG. 6)

Subsequently, an oxide film 67 as a shield film is formed on the surfaces of the P base layer 64 and the N+ emitter regions 66, and a mask for silicon etching having zonal openings with a width narrower than the N+ emitter region 66 on the surfaces of the N+ emitter regions 66 is formed from this oxide film 67, and etching is conducted by the RIE (Reactive Ion Etching) using the mask for silicon etching as a mask, and thus the trenches 68 are formed which extend from the N+ emitter region 66 surfaces through to the N− layer 62. (Refer to FIG. 7) Then, the oxide film 67 is removed by etching.

Next, a thermal oxide film 69 is formed on the surface of the trenches 68, the P base layers 64 and the N+ emitter regions 66, and polysilicon 70 doped with N-type impurities is provided on the oxide film 69 formed on the surface of the P base layers 64, the N+ emitter regions 66 and the trenches 68 so as to fill the trenches 68. (Refer to FIG. 8)

Next, the provided polysilicon 70 is etched back to the openings of the trenches 68, leaving the polysilicon 70 buried in the trenches 68. (Refer to FIG. 9).

Subsequently, a BPSG 71 is provided on the surface of the oxide film 69 on the surface of the P base layers 64 and the N+ emitter regions 66 and on the surfaces of the polysilicon 70 buried in the trenches 68. (Refer to FIG. 10)

Next, resist is provided on the surface of the BPSG 71 and a resist pattern 72 with zonal openings surrounding the surface of the P base layer 64 and part of the N+ emitter regions 66 between adjacent trenches 68 and parallel to the trenches 68 is formed by the photolithography process, and then etching is applied to the BPSG 71 and the oxide film 69 using the resist pattern 72 as a mask to form the interlayer insulating films 71 on the surface of the polysilicon 70 buried in the trenches 68. (Refer to FIG. 11)

After that, Al—Si is provided on the surface of element where the P base layers 64, the N+ emitter regions 66 and the interlayer insulating films 71 are provided so that the P base layers 64 and the N+ emitter regions 66 exposed by the etching are shorted, and thus the gate interconnection connected to the emitter electrode 73 and the polysilicon 70 in the trenches 68 and the gate pad are made simultaneously. (Refer to FIG. 12)

Further, a drain electrode is formed on the surface of the P+ substrate 60.

By adopting such manufacturing steps, the U-type IGBT of this preferred embodiment can be manufactured at low cost.

Second Preferred Embodiment

Figure 13:
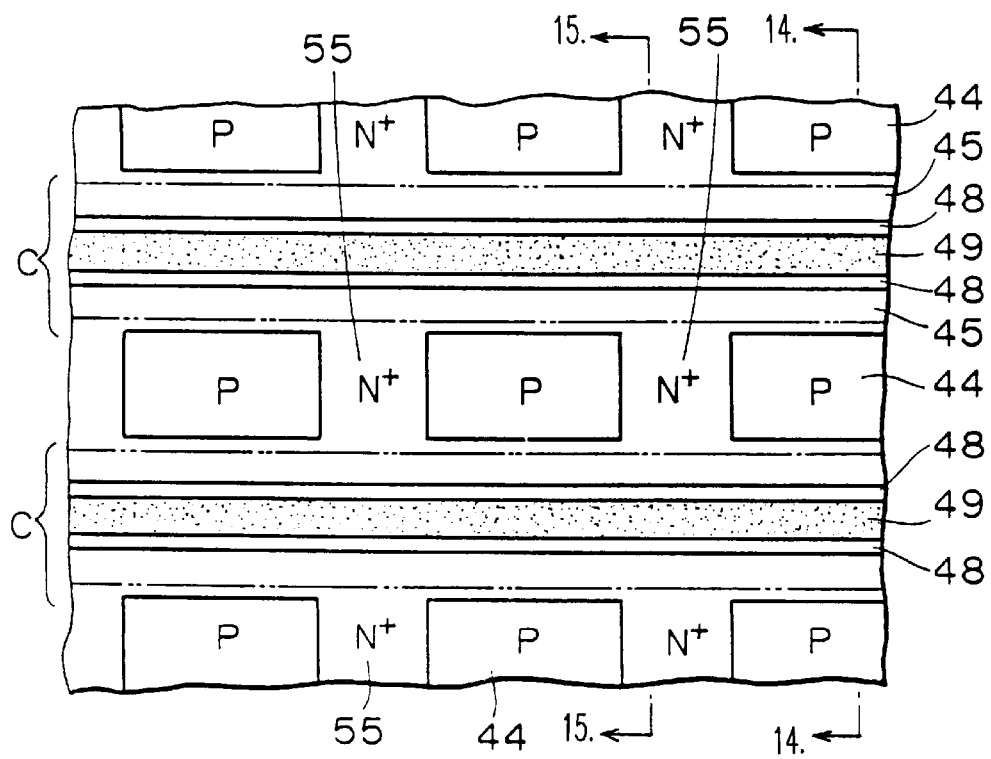
FIG. 13 is a fragmentary plan view of an insulated gate semi conductor device according to another preferred embodiment of the present invention.
Figure 14:
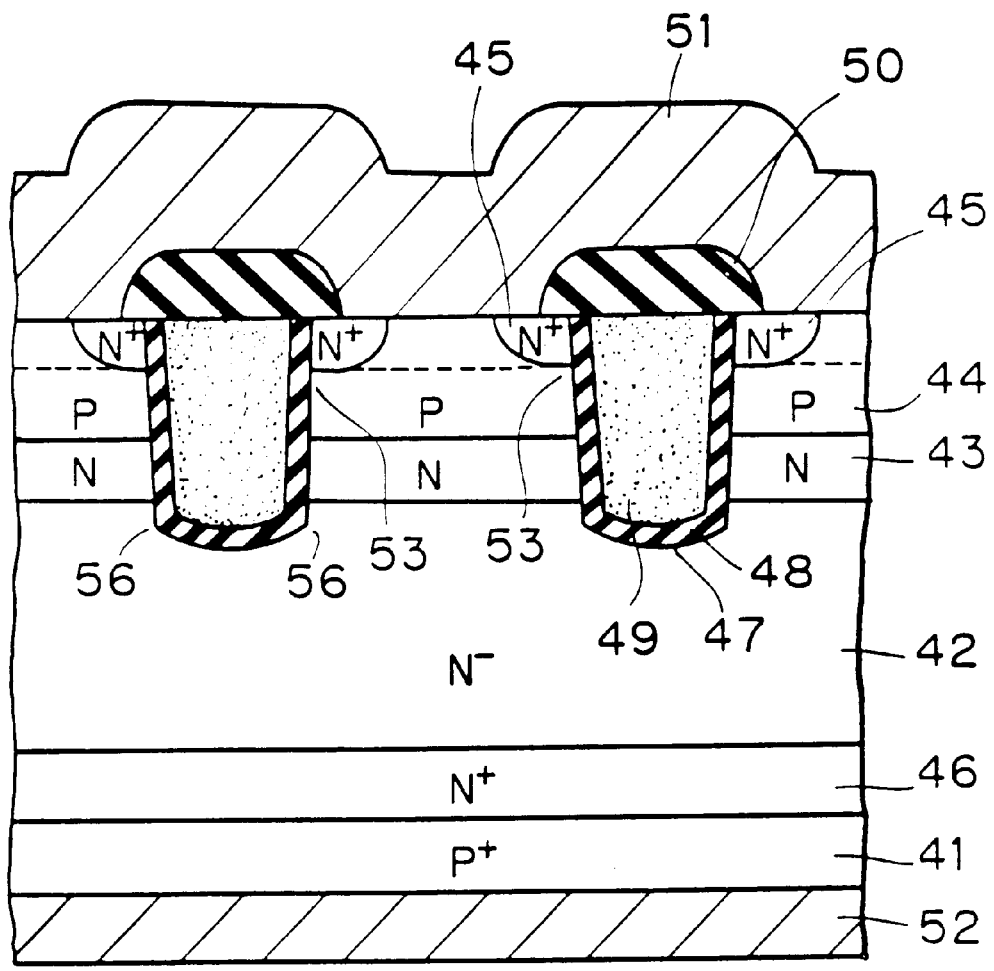
FIG. 14 is a fragmentary sectional view taken along the A—A section of the insulated gate semiconductor device according to another preferred embodiment of the present invention.
Figure 15:
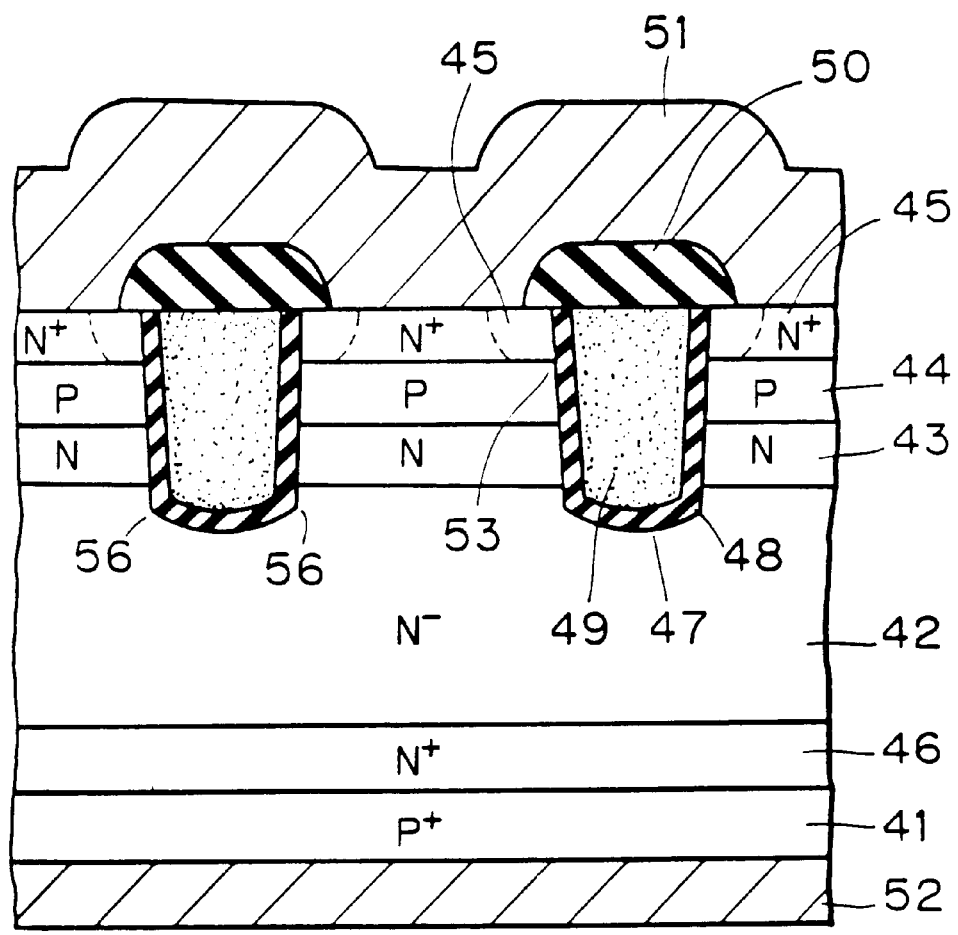
FIG. 15 is a fragmentary sectional view taken along the B—B section of the insulated gate semiconductor device according to another preferred embodiment of the present invention.

FIG. 13 is a fragmentary plan view of a U-type IGBT according to another preferred embodiment of the present invention, FIG. 14 is a fragmentary sectional view along the A—A section of part of the cells shown in FIG. 13, and FIG. 15 is a fragmentary sectional view along the B—B section of the part of cells shown in FIG. 13. FIG. 13 is depicted with the emitter electrode 51 and the interlayer insulating film 50 removed therefrom. The region C between the two-dot chain lines shown by the braces is a region covered with the interlayer insulating film 50.

In FIG. 13, FIG. 14, and FIG. 15, in the U-type IGBT of this preferred embodiment, the plane shape of the N+ emitter region 45 formed between trenches 47 is formed in a ladder-like shape. That is to say, the N+ emitter regions 45 are zonally arranged in parallel with the exposed surfaces of the P base region 44 interposed therebetween, the trenches having openings in the surface of the N+ emitter region 45 extend in the elongate direction of the N+ emitter regions 45, and the N+ emitter regions 45 between adjacent gate electrodes 49 are coupled with coupling portions 55, the exposed surfaces of the P base region 44 being disposed alternately with the coupling portions 55.

Structure in other parts is the same as the U-type IGBT of the first preferred embodiment.

By forming the plane shape of the N+ emitter region 45 in such ladder-like shape, the contact region in which the emitter electrode 51 puts the N+ emitter region 45 and the P base region 44 into contact can be taken in the coupling portion 55, so that it is not necessary to consider mask errors when forming the contact regions. That is, it is not necessary to consider margin for mask error when forming the resist pattern 72 shown in FIG. 11, so that the cell intervals can be reduced, and then the cells can be miniaturized more as compared with the structure in which the N+ emitter regions 45 are formed simply along the gate electrodes 49, as shown in FIG. 2. Also, the contact regions can be disposed in good balance in the entire surface of the element.

Accordingly, higher density of the elements can be realized and the ON voltage can be reduced, and performance characteristics of respective cells can be uniform in the entire element.

Third Preferred Embodiment

Figure 16:
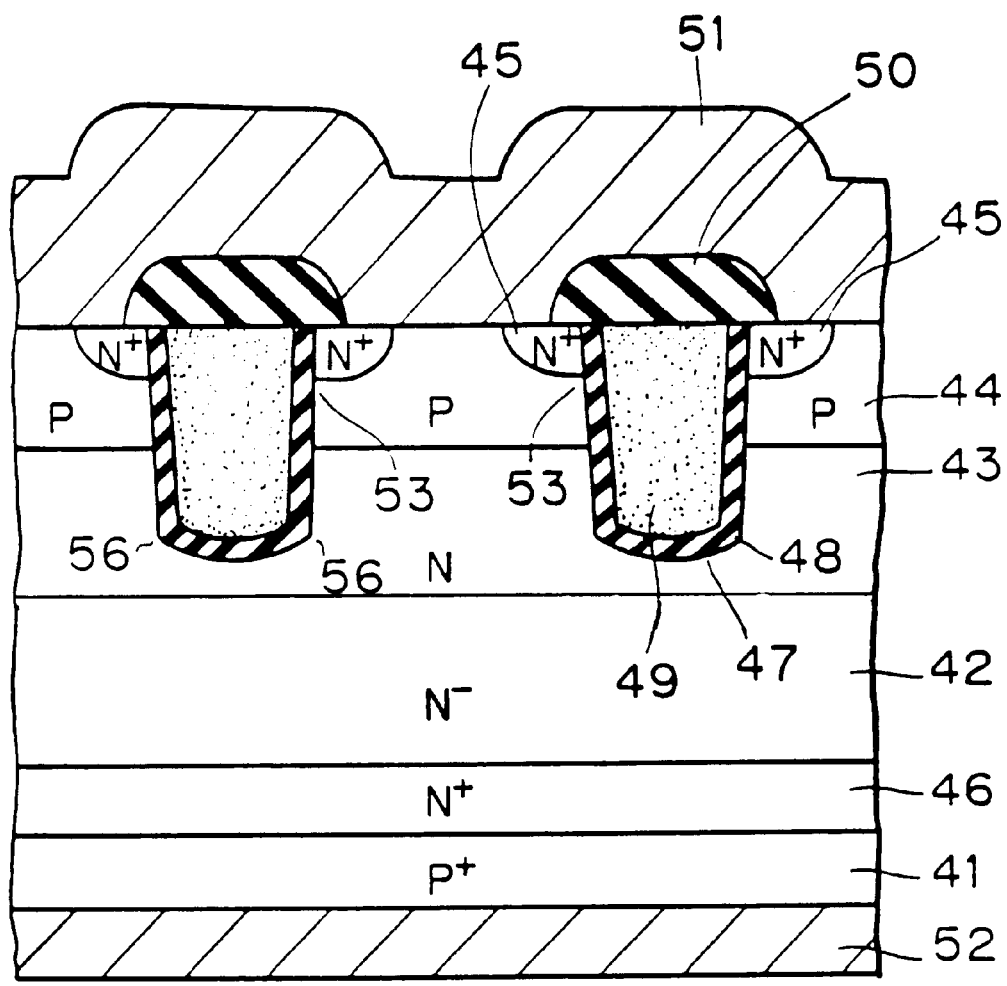
FIG. 16 is a fragmentary sectional view of an insulated gate semiconductor device according to still another preferred embodiment of the present invention.

FIG. 16 is a fragmentary sectional view of a U-type IGBT according to still another preferred embodiment of the present invention.

In FIG. 16, in the U-type IGBT of this preferred embodiment, the N layer 43 has a larger thickness so that the boundary between the N layer 43 and the N− layer 42 is deeper than the end of the trench 47.

Other structure is the same as the first preferred embodiment.

Figure 29:
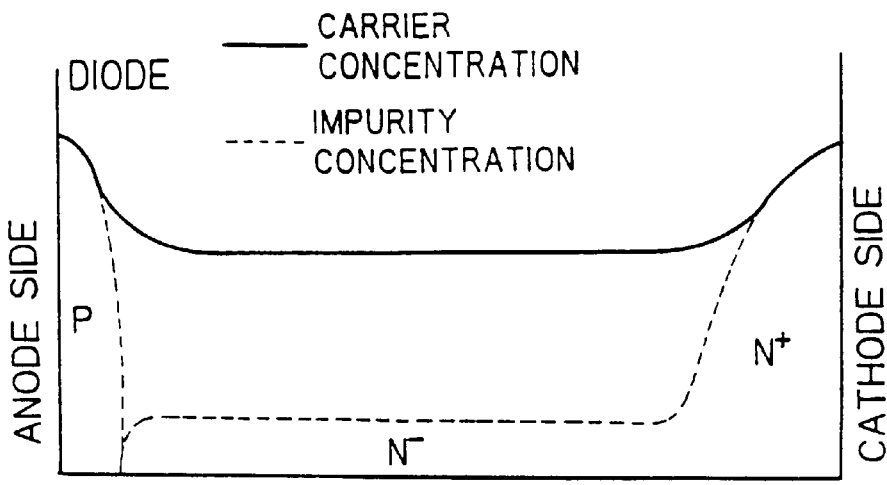
FIG. 29 is a graph showing the carrier concentration distribution of an $N^-$ layer of a PIN diode.
Figure 30:
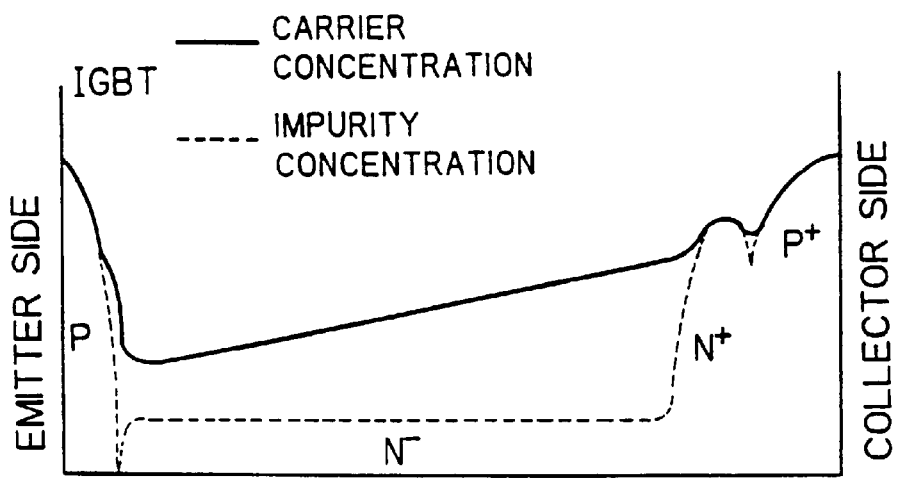
FIG. 30 is a graph showing the carrier concentration distribution of the $N^-$ layer of the conventional IGBT.
Figure 31:
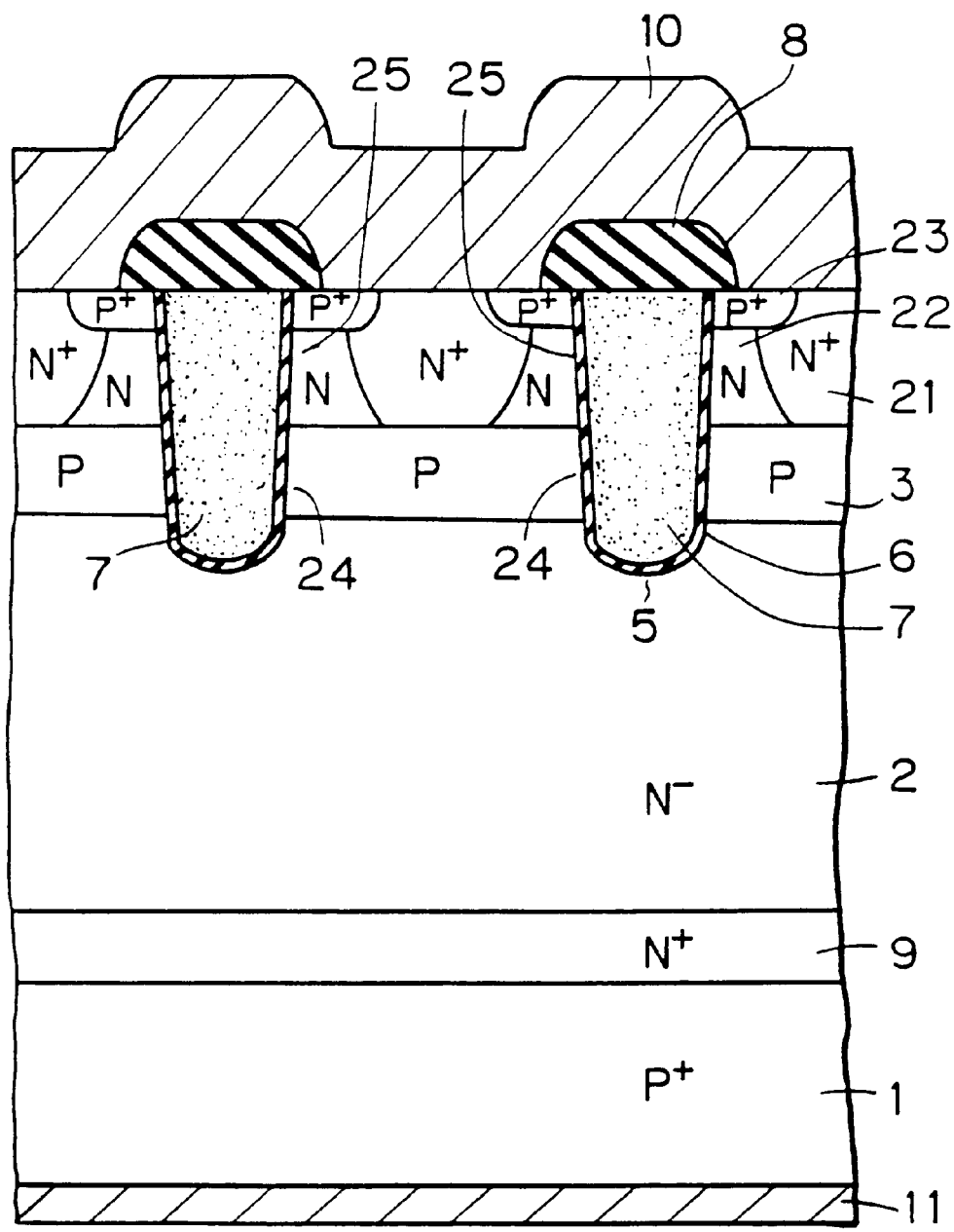
FIG. 31 is a fragmentary sectional view of a conventional insulated gate semiconductor device.

In this preferred embodiment, holes injected into the N− layer 42 in an ON state go through to the emitter electrode 51, but the movement of the holes to the P base layer 44 is restricted by the N layer 43, and the holes are accumulated in the N− layer 42 in the vicinity of the boundary between the N− layer 42 and the N layer 43, with the result that the N− layer 42 has such carrier distribution as of the diode shown in FIG. 29 and the ON voltage is reduced, as in the first preferred embodiment.

In this preferred embodiment, the ON voltage is reduced more because the N layer 43 with low resistance is thicker.

Figure 17:
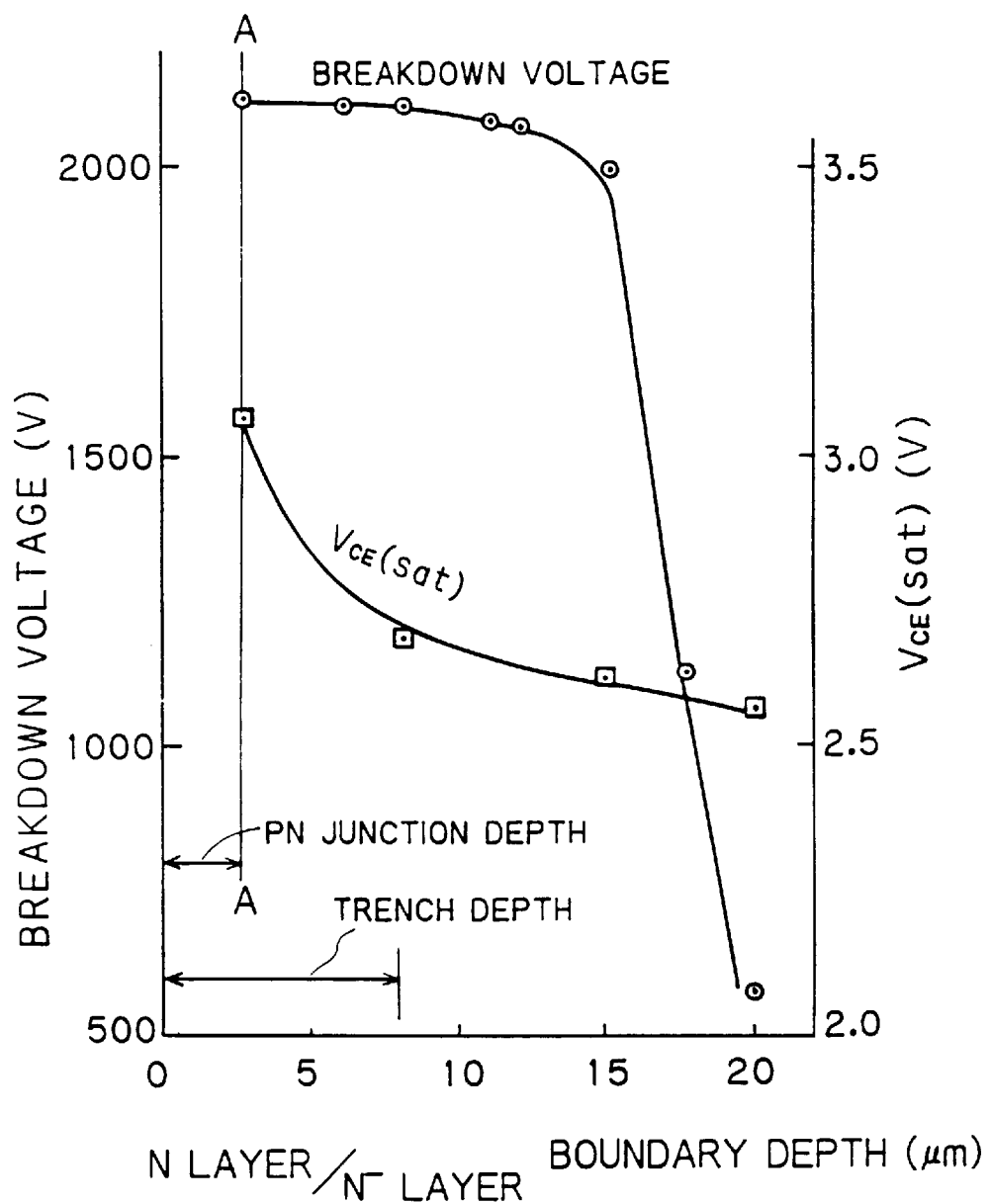
FIG. 17 is a graph showing values of the breakdown voltage and the ON voltage of the insulated gate semiconductor device of the present invention.

FIG. 17 is a graph showing values of the breakdown voltage and the ON voltage with respect to the depth of the boundary between the N− layer 42 and the N layer 43. The abscissa shows the depth from the element surface, i.e., the exposed surface of the P base layer 44 or the surface of the N+ emitter region 45 to the boundary between the N− layer 42 and the N layer 43, and the left ordinate shows the breakdown voltage and the right ordinate shows the ON voltage $V_{CE(SAT)}$.

As to the conditions of this simulation, the thickness from the element surface, i.e., the exposed surface of the P base layer 44 or the surface of the N+ emitter region 45 to the boundary between the N− layer 42 and the N+ buffer layer 46 is about 200 $\mu$m, the impurity concentration of the N− layer 42 is $5 \times 10^{13}$ cm$^{-3}$, the interval of the trench 47 is about 4

μm, and the depth of the trench 47 from the surface of the N+ emitter region 45 is about 8 μm.

In FIG. 17, A—A designates the depth of the boundary between the P base layer 44 and the N layer 43 from the element surface, and the values of the breakdown voltage and the ON voltage on this line are those in the case where the boundary depth of the P base layer 44 and the N layer 43 and the boundary depth of the N⁻ layer 42 and the N layer 43 are the same, that is, where no N layer 43 is provided.

As can be seen from FIG. 17, the value of $V_{CE(SAT)}$ decreases as the thickness of the N layer 43 increases, and the ON voltage decreases in correspondence with the thickness of the N layer 43. The breakdown voltage, however, rapidly decreases when exceeding a certain critical value of the thickness of the N layer 43. In this preferred embodiment, the breakdown voltage rapidly decreases when the boundary depth of the N⁻ layer 42 and the N layer 43 becomes deeper than the bottom of the trench 47 by about 8 μm. Accordingly, the ON voltage can be made as low as possible by making the N layer 43 thicker as far as the breakdown voltage permits.

When the N layer 43 is arranged so that the boundary between the N layer 43 and the N⁻ layer 42 is deeper than the end of the trench 47 as in this preferred embodiment, it can be applied effectively especially to the case of elements with high breakdown voltage class.

That is to say, if the collector voltage in the OFF state is high, the electric field concentration in the vicinity of the end comer 56 of the trench 47 does not affect a decrease in the breakdown voltage so much even if the end of the trench 47 largely protrudes from the boundary between the P base layer 44 and the N layer 43.

Also, as the class of the breakdown voltage is high, even if the N layer 43 is made thicker, the N layer 43 with such thickness as will not cause the breakdown voltage to rapidly decrease does not serve as a barrier against the movement of the holes when changing from the ON state to the OFF state, producing no effects on the decrease of the current in turn off.

Accordingly, the structure of this preferred embodiment can provide a U-type IGBT with a lower ON voltage.

Further, the structure of this preferred embodiment where the N layer 43 has a large thickness so that the boundary between the N layer 43 and the N⁻ layer 42 is deeper than the end of the trench 47 with the plane shape of the N⁺ emitter region 45 being in the ladder-like form as in the second preferred embodiment can make the cell density higher and the performance characteristics of elements uniform.

Fourth Preferred Embodiment

Figure 18:
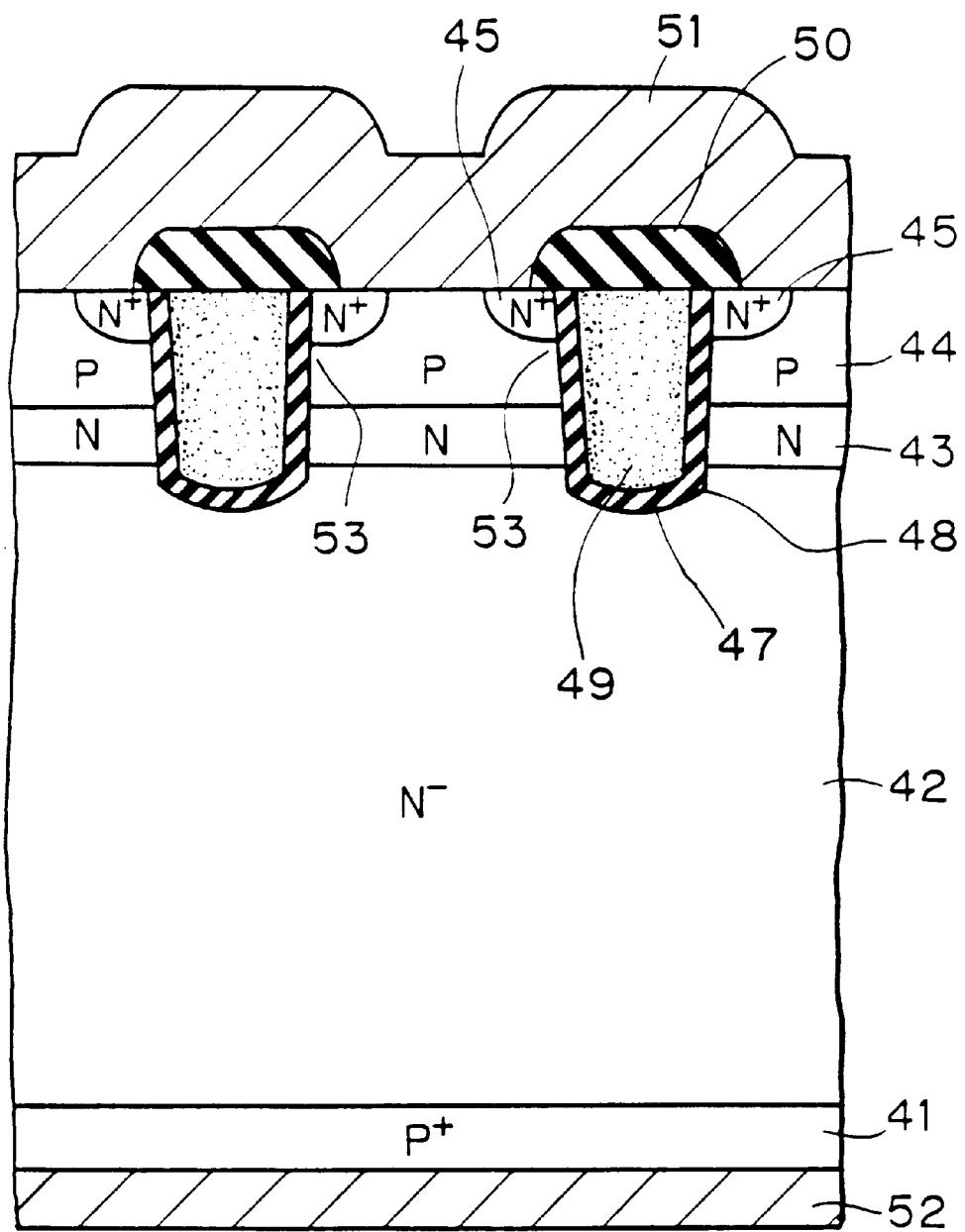
FIG. 18 is a fragmentary sectional view of an insulated gate semiconductor device according to a further preferred embodiment of the present invention.

FIG. 18 is a fragmentary sectional view of a U-type IGBT according to yet another preferred embodiment of the present invention.

In FIG. 18, in this U-type IGBT, the N⁻ layer 42 is directly provided in contact with the P⁺ collector layer 41, and the N⁻ layer 42 has its thickness greater than a depletion layer extending from the P base layer 44 when the collector voltage is applied.

In the case of elements in a high breakdown voltage class of 2000 V or above, the thickness of the N⁻ layer 42 becomes rather thick to ensure the breakdown voltage. Accordingly, formation of the N⁻ layer 42 on the P⁺ substrate by the epitaxial growth when producing the element is not advantageous in cost because the epitaxial growth requires a lot of time. Therefore, the production cost can be reduced by using the N⁻ silicon substrate.

Figure 19:
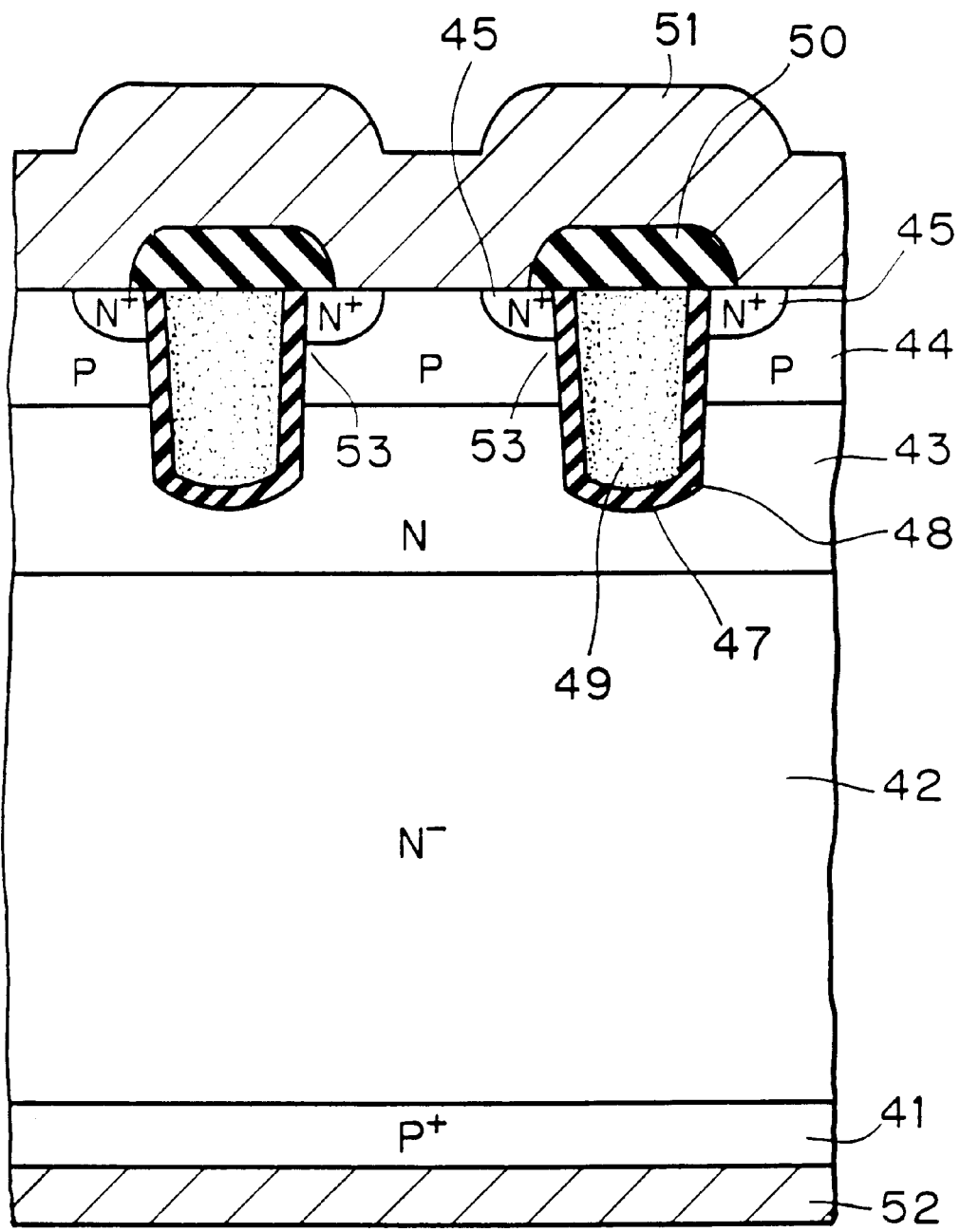
FIG. 19 is a fragmentary sectional view of a modified example of the insulated gate semiconductor device according to the further preferred embodiment of the present invention.

FIG. 19 is a fragmentary sectional view of a modified example of the preferred embodiment of the insulated gate semiconductor device of FIG. 18.

In the U-type IGBT of FIG. 19, the N⁻ layer 42 is directly provided in contact with the P⁺ collector layer 41, and the thickness of the N⁻ layer 42 is greater than a depletion layer extending from the P base layer 44 when the collector voltage is applied and the thickness of the N layer 43 is great so that the boundary between the N layer 43 and the N⁻ layer 42 is deeper than the end of the trench 47, which produces the same effects as the case of FIG. 18.

In this preferred embodiment, further by forming the plane shape of the N⁺ emitter region 45 into a ladder-like form as the second preferred embodiment, the cell density of element can be increased and the ON voltage can be decreased, and the performance characteristics of each cell can be uniform in the entire element.

Next, an example of a method of manufacturing the U-type IGBT of this preferred embodiment will be described.

Figure 20:
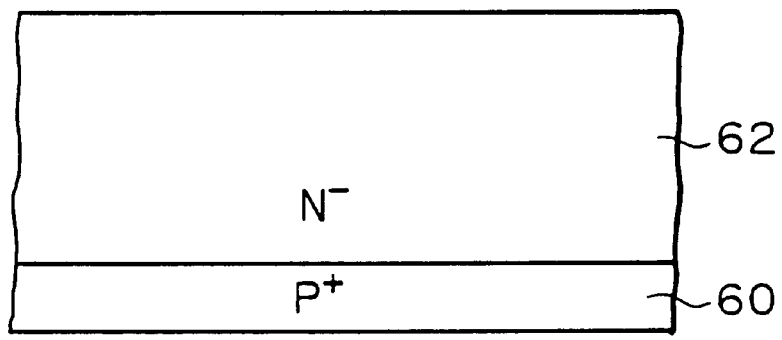
FIG. 20 is a fragmentary sectional view of the element in a process of manufacturing the insulated gate semiconductor device according to the further preferred embodiment of the present invention.

FIG. 20 is a fragmentary sectional view showing the element in the manufacturing process of the method of manufacturing the U-type IGBT of this preferred embodiment. Parts which are different from the processes in the manufacturing method shown in the first preferred embodiment are shown here.

First, P-type impurities are implanted into one main surface of the N⁻ silicon substrate 62 and annealing is applied for diffusion, and thus the P⁺ collector layer 60 is formed. (Refer to FIG. 20)

Next, N-type impurities are implanted into the other main surface of the N⁻ silicon substrate 62 and annealing is applied to diffuse the N-type impurities to form the N layer 63. Further, P-type impurities are implanted into the surface of the N layer 63 and annealed so as to form the P base layer 64. (Refer to FIG. 5)

Figure 6:
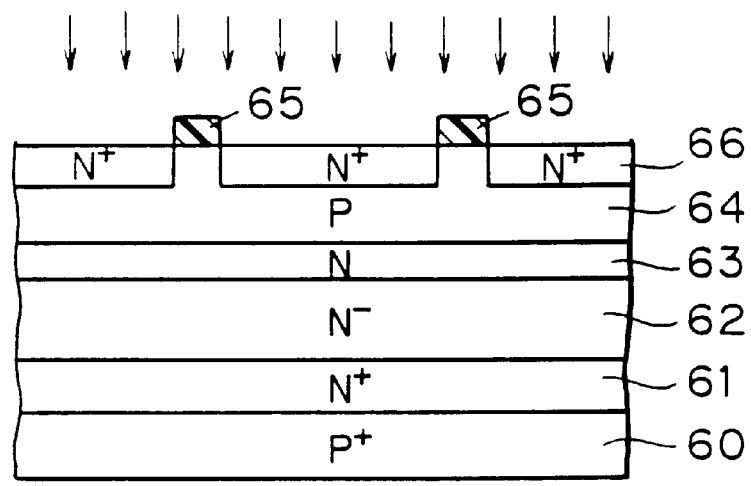
FIG. 6 is a fragmentary sectional view of the element in a process of manufacturing the insulated gate semiconductor device of the present invention.
Figure 7:
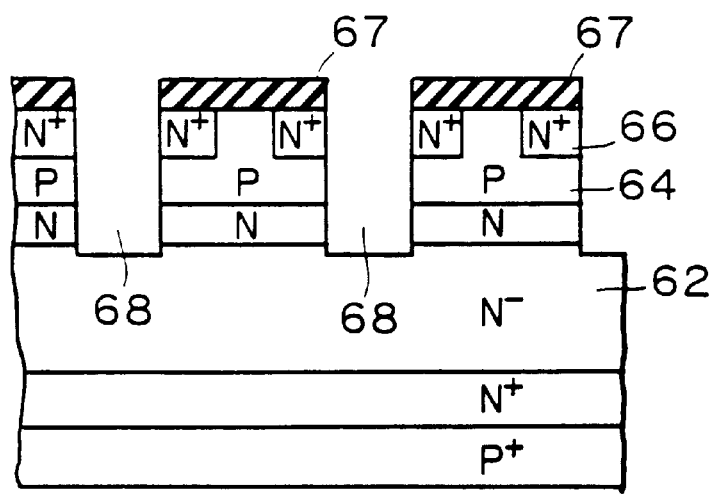
FIG. 7 is a fragmentary sectional view of the element in a process of manufacturing the insulated gate semiconductor device of the present invention.
Figure 8:
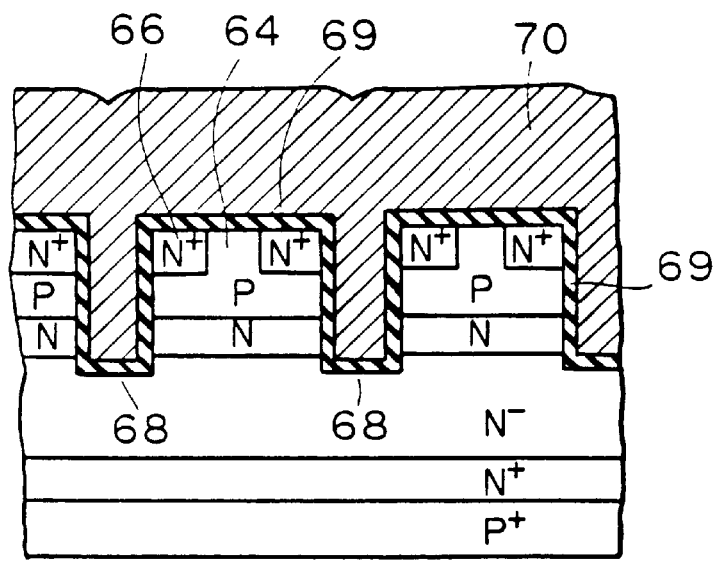
FIG. 8 is a fragmentary sectional view of the element in a process of manufacturing the insulated gate semiconductor device of the present invention.
Figure 9:
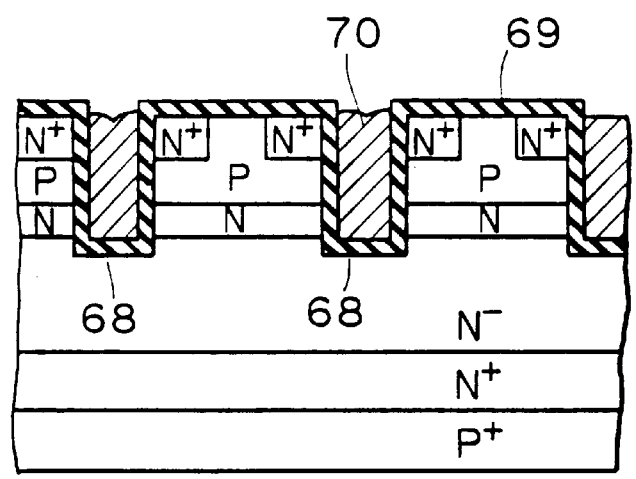
FIG. 9 is a fragmentary sectional view of the element in a process of manufacturing the insulated gate semiconductor device of the present invention.
Figure 10:
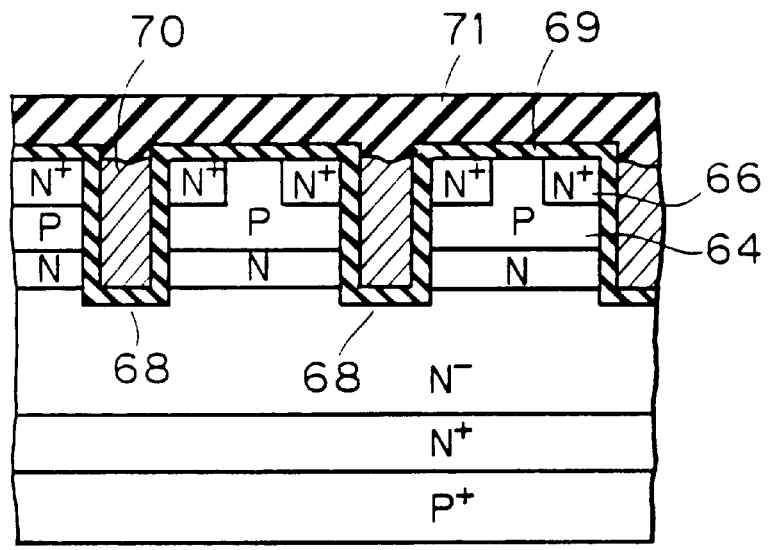
FIG. 10 is a fragmentary sectional view of the element in a process of manufacturing the insulated gate semiconductor device of the present invention.
Figure 11:
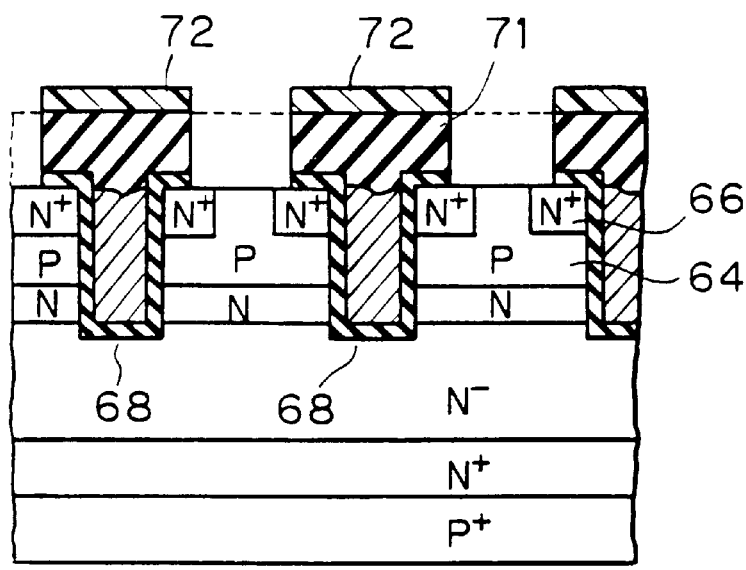
FIG. 11 is a fragmentary sectional view of the element in a process of manufacturing the insulated gate semiconductor device of the present invention.
Figure 12:
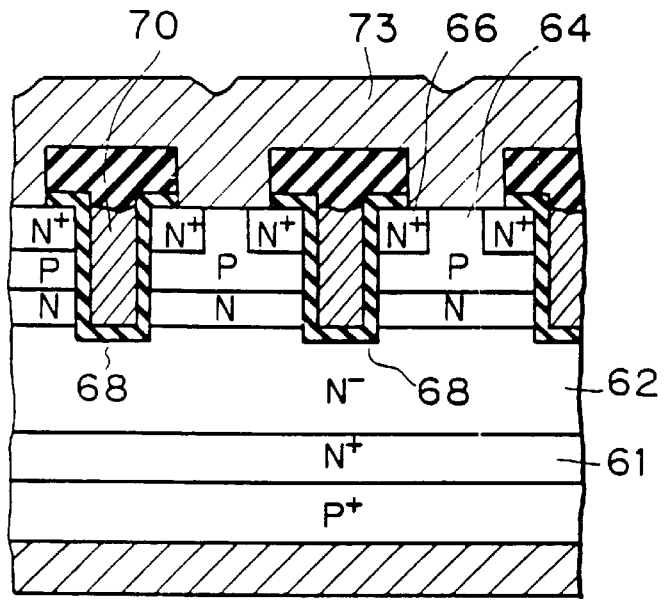
FIG. 12 is a fragmentary sectional view of the element in a process of manufacturing the insulated gate semiconductor device of the present invention.

Processes of the element production of and after the process of forming the N⁺ emitter region 66 in the surface of the P base layer 64 are the same as the processes in and after FIG. 6 in the first preferred embodiment.

Figure 21:
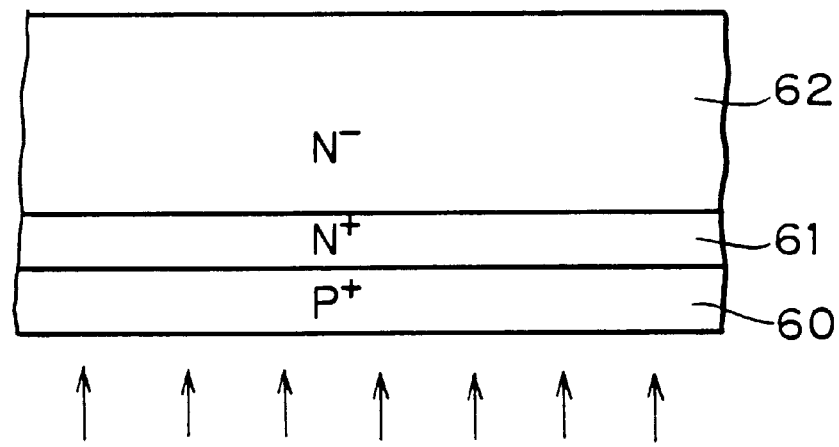
FIG. 21 is a fragmentary sectional view of the element in a process of manufacturing the insulated gate semiconductor device according to the further preferred embodiment of the present invention.

FIG. 21 is a fragmentary sectional view showing the element in a manufacturing process of a modified example of the U-type IGBT of this preferred embodiment.

Although the manufacturing method in which the N⁻ layer 42 is directly provided adjacent to the P⁺ collector layer 41 has been discussed in the manufacturing method of FIG. 20, the N⁺ buffer layer 46 may be provided between the P⁺ collector layer 41 and the N⁻ layer 42. FIG. 21 shows a manufacturing method in this case.

In FIG. 21, N-type impurities are implanted into one main surface of the N⁻ silicon substrate 62 and then annealing is applied to diffuse the N-type impurities and then the N⁺ layer 61 is formed. Further, P-type impurities are implanted into the surface of the N⁺ layer 61 and annealing is applied and then the P⁺ layer 60 is formed. (Refer to FIG. 21)

Next, N-type impurities are implanted into the other main surface of the N⁻ silicon substrate 62 and annealing is applied to diffuse the N-type impurities and then the N layer 63 is formed. Further, P-type impurities are implanted into the surface of this N layer 63 and annealing is applied and then the P base layer 64 is formed. (Refer to FIG. 5)

Processes of the element production of and after the process of forming the N⁺ emitter region 66 in the surface of the P base layer 64 are the same as processes in and after FIG. 6 in the first preferred embodiment.

In the manufacturing processes of this preferred embodiment, assuming the impurity concentrations of the N⁻ layer 62, the N layer 63 and the P base layer 64 to be $C_2$, $C_3$, and $C_4$, performing implantation and diffusion of the N-type impurities and the P-type impurities so that they have relation of $C_2 < C_3 < C_4$ will facilitate implant of the P-type impurities and a manufacturing time is reduced, as in the first preferred embodiment.

As has been described above, the manufacturing cost can be reduced by using the N⁻ silicon substrate in this preferred embodiment.

Fifth Preferred Embodiment

Figure 22:
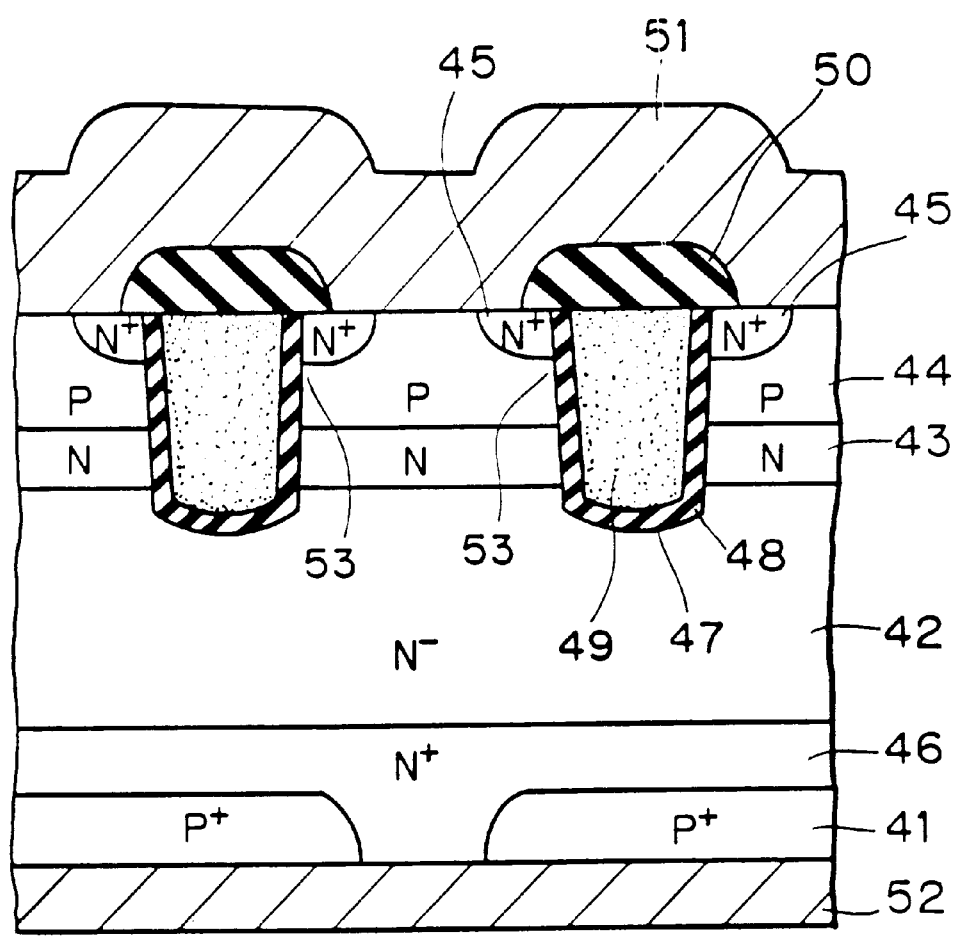
FIG. 22 is a fragmentary sectional view of an insulated gate semiconductor device according to still another preferred embodiment of the present invention.

FIG. 22 is a fragmentary sectional view of a U-type IGBT according to still another preferred embodiment of the present invention.

In FIG. 22, the N⁺ buffer layer 46 extends through a part of the P⁺ collector layer 41 to be exposed and the exposed surface of the N⁺ buffer layer 46 and the surface of the P⁺ collector layer 41 are both in contact with the collector electrode 52 and shorted.

When the IGBT turns from the ON state to the OFF state, after injection of electrons from the emitter electrode 51 stops and injection of holes from the P⁻ collector layer 41 to the N⁻ layer 42 also stops, part of electrons accumulated in the N⁻ layer 42 go through to the collector electrode 52. At this time, if the exposed surface of the N⁺ buffer layer 46 and the collector electrode 52 are shorted, electrons can rapidly move to the collector electrode 52. The speed of this movement affects the speed of switching, and which can increase the speed of turn off of the U-type IGBT.

Figure 23:
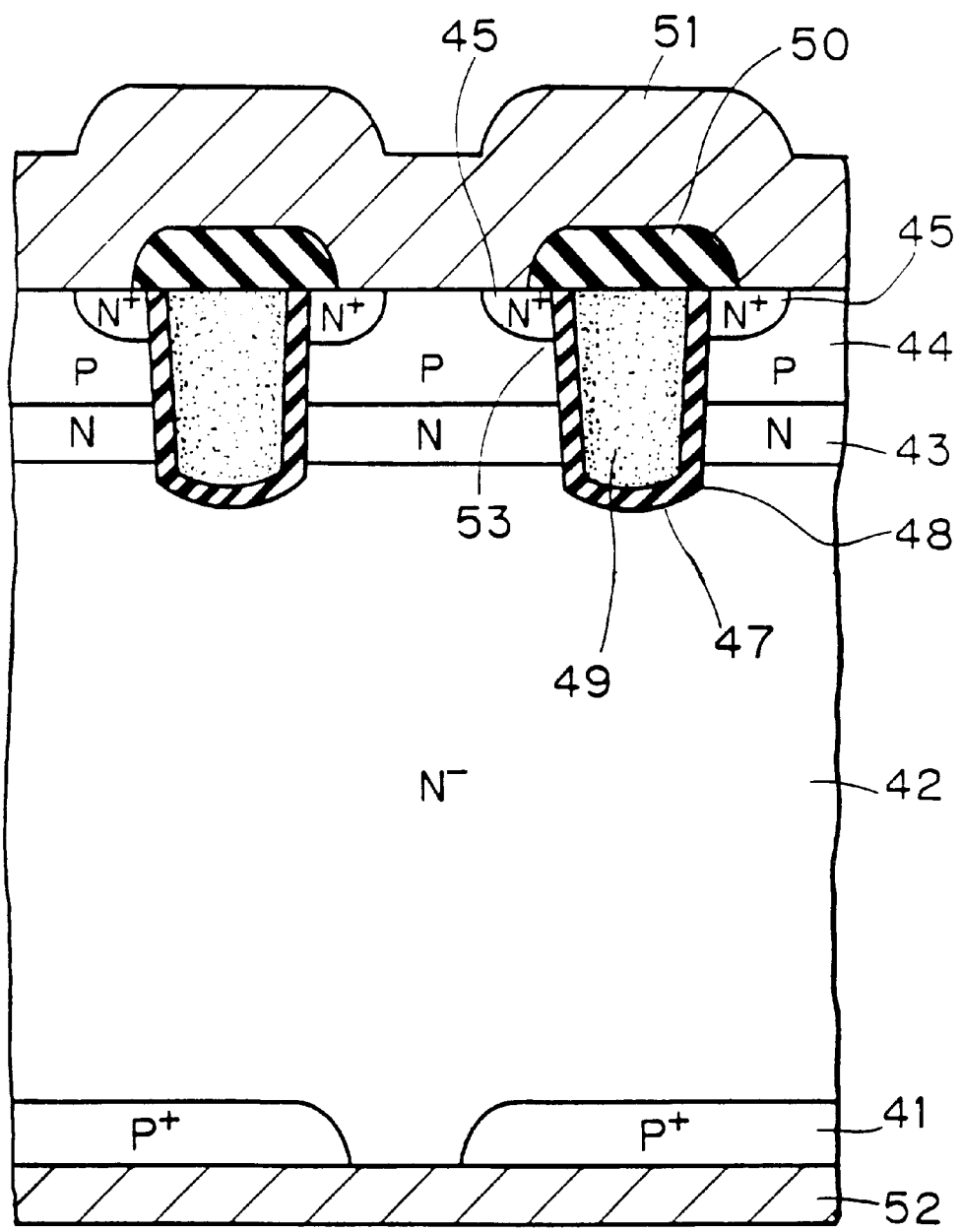
FIG. 23 is a fragmentary sectional view of the insulated gate semiconductor device according to the still another preferred embodiment of the present invention.

FIG. 23 is a fragmentary sectional view of a U-type IGBT which is a modified example of this preferred embodiment.

This shows an example which is applied to an element with a rather thick N⁻ layer 42 of the fourth preferred embodiment.

In FIG. 23, the N⁻ layer 42 passes through a part of the P⁺ collector layer 41 and is exposed, and the exposed surface of the N⁻ layer 42 and the surface of the P⁺ collector layer 41 are both in contact with the collector electrode 52 and shorted.

In this case, as in the preferred embodiment of FIG. 22, when the U-type IGBT turns off, electrons accumulated in the N⁻ layer 42 can rapidly move to the collector electrode 52. Accordingly, speed of turn off of the U-type IGBT can be increased.

The U-type IGBT in which the N⁺ buffer layer 46 or the N⁻ layer 42 extends through a part of the P⁺ collector layer 41 and has an exposed surface as in this preferred embodiment can be manufactured at low cost by adopting the manufacturing method which uses the N⁻ silicon substrate described in the fourth preferred embodiment.

Next, an example of a method of manufacturing the U-type IGBT of this preferred embodiment will be described.

Figure 24:
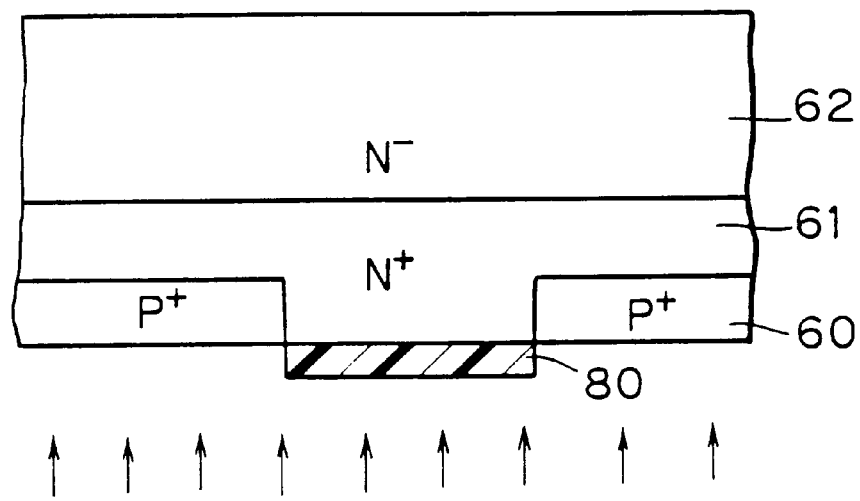
FIG. 24 is a fragmentary sectional view of the element in a process of manufacturing the insulated gate semiconductor device according to the still another preferred embodiment of the present invention.

FIG. 24 is a fragmentary sectional view of an element in a process for manufacturing the U-type IGBT of this preferred embodiment. There shown are parts different from the processes of the manufacturing method shown in the fourth preferred embodiment.

In FIG. 24, first, N-type impurities are implanted into one main surface of the N⁻ silicon substrate 62 and annealing is applied to diffuse the N-type impurities and then the N⁺ layer 61 is formed. Next, resist is provided on the surface of the N⁺ layer 61, a resist pattern 80 having partial opening is formed by the photolithography process, and P-type impurities are implanted to a high concentration in the surface of the N⁺ layer 61 using the resist pattern 80 as a mask and diffused by annealing, leaving part of the surface of the N⁺ layer 61 as an exposure surface, and then the P⁺ collector layer 60 is selectively formed.

Processes of and after the process of forming the N layer 63 in the other main surface of the N⁻ silicon substrate 62 are the same as those in the fourth preferred embodiment.

Figure 25:
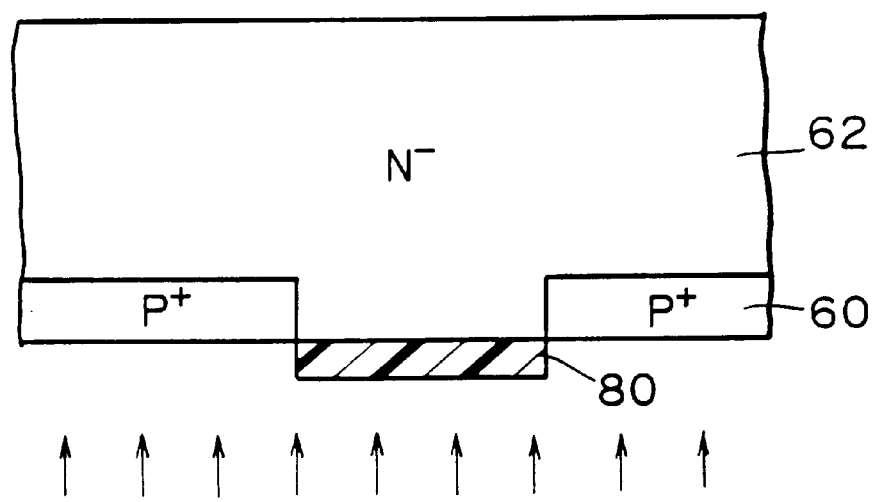
FIG. 25 is a fragmentary sectional view of the element in a process of manufacturing the insulated gate semiconductor device according to the still another preferred embodiment of the present invention.
Figure 26:
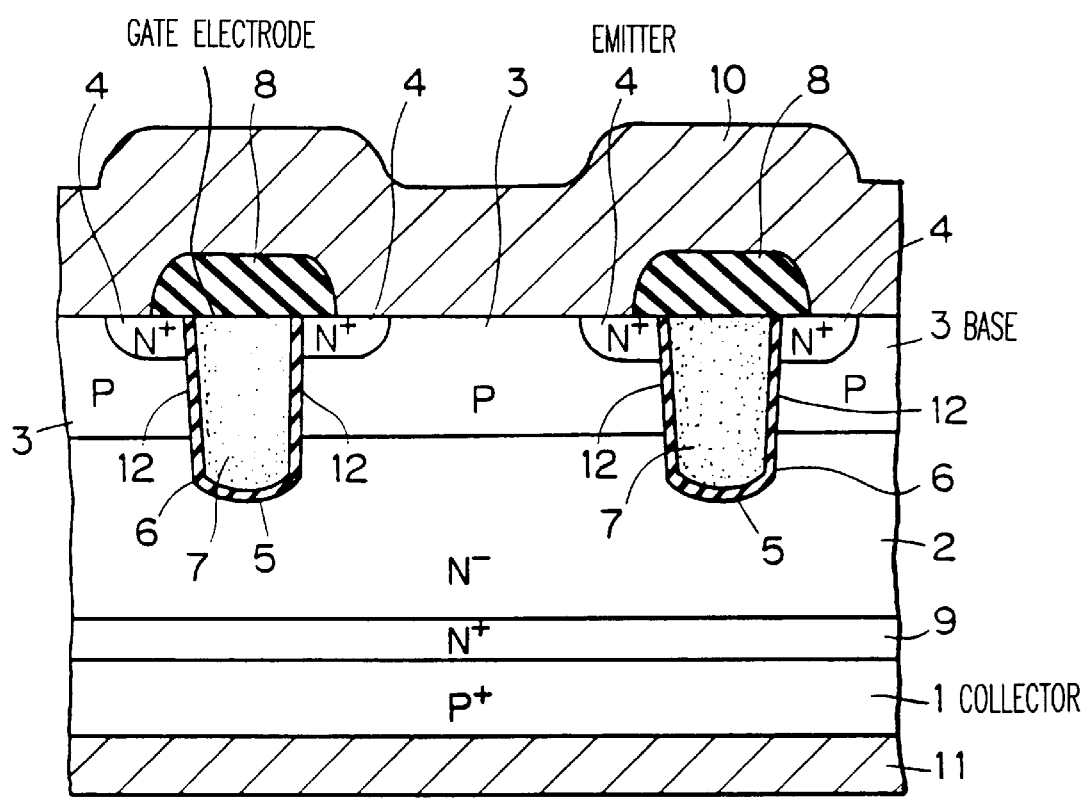
FIG. 26 is a fragmentary sectional view of a conventional IGBT.
Figure 27:
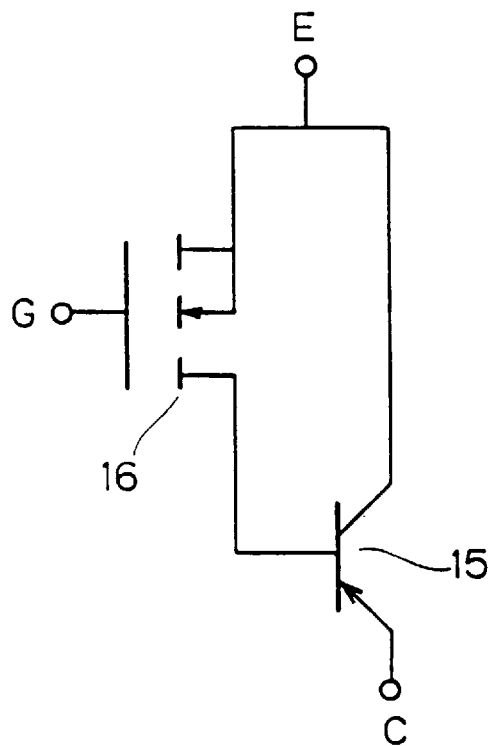
FIG. 27 is a circuit diagram showing an equivalent circuit of the IGBT.
Figure 28:
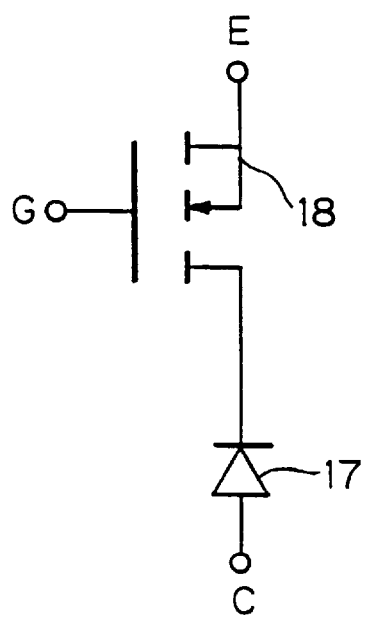
FIG. 28 is a circuit diagram showing an equivalent circuit of the IGBT.

FIG. 25 is a fragmentary sectional view of an element in a manufacturing process in the modified example of the U-type IGBT of this preferred embodiment.

According to the manufacturing method of FIG. 25, the P⁺ collector layer is directly formed in one main surface of the N⁻ silicon substrate 62.

In FIG. 25, first, resist is provided on one main surface of the N⁻ silicon substrate 62, a resist pattern 80 having a partial opening is formed by the photolithography, and P-type impurities are implanted to a high concentration into one main surface of the N⁻ silicon substrate 62 by using the resist pattern 80 as a mask and diffused by annealing, leaving part of the surface of the N⁻ silicon substrate 62 as an exposure surface, and then the P⁺ collector layer 60 is selectively formed.

Processes of and after the process of forming the N layer 63 in the other main surface of the N⁻ silicon substrate 62 are the same as those in the fourth preferred embodiment.

The U-type IGBTs in which the N⁺ buffer layer 46 or the N⁻ layer 42 passes through a part of the P⁺ collector layer 41 and has an exposure surface can be manufactured at low cost according to the manufacturing method.

By the way, although the present invention has been described about the N-channel U-type IGBT in the description above, it is a matter of course that the present invention can be applied to the P-channel U-type IGBTs.

While the invention has been described in detail, the foregoing description is in all aspects illustrative and not restrictive. It is understood that numerous other modifications and variations can be devised without departing from the scope of the invention.

I claim:

1. A method of manufacturing an insulate gate semiconductor device, comprising:

a substrate forming step of forming a semiconductor substrate defining first and second main surfaces and having a first semiconductor layer of a first conductivity type and a second semiconductor layer of a second conductivity type with a lower impurity concentration, said first semiconductor layer being exposed in said first main surface and said second semiconductor layer being exposed in said second main surface;

a first implantation step of implanting and diffusing impurity of the second conductivity type to an impurity concentration higher than the impurity concentration of said second semiconductor layer into said second main surface of said semiconductor substrate to form a third semiconductor layer of the second conductivity type in a surface portion of said second semiconductor layer;

a second implantation step of implanting and diffusing impurity of the first conductivity type in a surface of said third semiconductor layer to form a fourth semiconductor layer of the first conductivity type in a surface portion of said third semiconductor layer, wherein said third semiconductor layer is so formed as to be thinner after forming said fourth semiconductor layer than said second semiconductor layer remaining;

a third implantation step of selectively implanting and diffusing impurity of the second conductivity type in a surface of said fourth semiconductor layer to selectively form a fifth semiconductor layer of the second conductivity type in a surface portion of said fourth semiconductor layer;

a first removing step of forming a shield film having an opening surrounding a part of a surface of said fifth semiconductor layer on the surface of said fourth semiconductor layer and the surface of said fifth semiconductor layer and selectively removing a portion of said fifth semiconductor layer, a portion of said fourth semiconductor layer and a portion of said third semiconductor layer using the shield film as a mask to form a trench with a depth extending at least into said third semiconductor layer through said fourth semiconductor layer, and removing said shield film after that;

a first step forming an insulating film on surfaces of said trench, said fourth semiconductor layer and said fifth semiconductor layer;

a first provision step of providing a conductor on said insulating film so as to fill said trench;

a second removing step of uniformly removing said provided conductor to the opening of said trench so as to leave the conductor in said trench as a control electrode;

a second provision step of providing an insulating layer on the surface of said insulating film and a surface of the conductor buried in said trench;

a third removing step of selectively removing said insulating layer and said insulating film in a region covering the surface of said fourth semiconductor layer and a part of the surface of said fifth semiconductor layer;

a step of providing a conductor on the surfaces of said fourth and fifth semiconductor layers exposed by said third removing step to form a first main electrode; and a step of providing a conductor on said first main surface of said semiconductor substrate to form a second main electrode.

2. The method of manufacturing the insulated gate semiconductor device according to claim 1, wherein, in said first removing step, said trench is formed with a depth extending also through said third semiconductor layer.

3. The method of manufacturing the insulated gate semiconductor device according to claim 1, wherein said trench is formed with a depth which stays in said third semiconductor layer in said first removing step.

4. The method of manufacturing the insulated gate semiconductor device according to claim 3, wherein, in said first removing step, said trench is formed with a depth so that a thickness of said third semiconductor layer between the bottom of said trench and said second semiconductor layer is not more than a critical thickness at which a rapid decrease appears in a breakdown voltage of said insulated gate semiconductor device with an increase in the thickness.

5. The method of manufacturing the insulated gate semiconductor device according to claim 1, wherein said substrate forming step comprises the steps of;

preparing a semiconductor substrate body of the first conductivity type having two main surfaces, and providing a semiconductor layer of the second conductivity type with a low impurity concentration by the epitaxial growth on one of the main surfaces of said semiconductor substrate body to form said second semiconductor layer.

6. The method of manufacturing the insulated gate semiconductor device according to claim 1, wherein said substrate forming step comprises the steps of;

preparing a semiconductor substrate body of the second conductivity type with a low impurity concentration having two main surfaces, implanting impurity of the first conductivity type into one of the main surfaces of said semiconductor substrate body; and diffusing said impurity implanted into said one main surface to form said first semiconductor layer of the first conductivity type.

7. The method of manufacturing the insulated gate semiconductor device according to claim 6, wherein said step of implanting the impurity of the first conductivity type comprises the steps of, selectively implanting impurity of the first conductivity type into said one main surface of said semiconductor substrate body.

8. The method of manufacturing the insulated gate semiconductor device according to claim 1, wherein said semiconductor substrate formed in said substrate forming step further comprises a sixth semiconductor layer of the second conductivity type with a high impurity concentration interposed between said first semiconductor layer and said second semiconductor layer.

9. The method of manufacturing the insulated gate semiconductor device according to claim 8, wherein said substrate forming step comprises the steps of;

preparing a semiconductor substrate body of the first conductivity type having two main surfaces, and sequentially forming said sixth semiconductor layer and said second semiconductor layer by the epitaxial growth on one of the main surfaces of said semiconductor substrate body.

10. The method of manufacturing the insulated gate semiconductor device according to claim 8, wherein said substrate forming step comprises the steps of;

preparing a semiconductor substrate body of the second conductivity type with a low impurity concentration having two main surfaces, forming said sixth semiconductor layer by implanting impurity of the second conductivity type and then diffusing on one of the main surfaces of said semiconductor substrate body, and implanting and then diffusing impurity of the first conductivity type in a surface of said sixth semiconductor layer to form said first semiconductor layer.

11. The method of manufacturing the insulated gate semiconductor device according to claim 1, wherein said step of forming said first semiconductor layer comprises the steps of;

selectively implanting impurity of the first conductivity type into the surface of said sixth semiconductor layer and diffusing said impurity selectively implanted into the surface of said sixth semiconductor layer.

12. The method of manufacturing the insulated gate semiconductor device according to claim 1, wherein, if the impurity concentrations in said second semiconductor layer, said third semiconductor layer and said fourth semiconductor layer are taken as $C_2$, $C_3$, $C_4$, respectively, said first implantation step and said second implantation step are carried out so that the relation thereof is $C_2<C_3<C_4$.

13. The method of manufacturing the insulated gate semiconductor device according to claim 1, wherein said third implantation step comprises steps of:
- forming a resist pattern selectively having an opening in a surface of said fourth semiconductor layer on the surface of said fourth semiconductor layer; and,
- implanting and diffusing impurity of the second conductivity type using the resist pattern as a mask to selectively form said fifth semiconductor layer of the second conductivity type in a surface portion of said fourth semiconductor layer.

14. The method of manufacturing the insulated gate semiconductor device according to claim 1, wherein said third removing step comprises steps of:
- forming a resist pattern having an opening surrounding the surface of said fourth semiconductor layer and a part of the surface of said fifth semiconductor layer on a surface of said insulating layer; and,
- selectively removing said insulating layer and said insulating film using the resist pattern as a mask.

15. The method of manufacturing the insulated gate semiconductor device according to claim 7, wherein said step of implanting the impurity of the first conductivity type further comprises the step of,
- forming a resist pattern having a selectively formed opening on said one main surface of said semiconductor substrate body, and
- said step of selectively implanting said impurity comprises the step of selectively implanting said impurity of the first conductivity type into said one main surface of said semiconductor substrate body using said resist pattern formed on said one main surface as a mask.

16. The method of manufacturing the insulated gate semiconductor device according to claim 11, wherein said step of forming said first semiconductor layer further comprises the step of;
- forming a resist pattern having a selectively formed opening on the surface of said sixth semiconductor layer, and
- said step of selectively implanting said impurity comprises the step of selectively implanting said impurity of the first conductivity type into the surface of said sixth semiconductor layer using said resist pattern formed on the surface of said sixth semiconductor layer as a mask.

* * * * *